United States Patent
Wang et al.

(10) Patent No.: US 11,327,045 B2
(45) Date of Patent: May 10, 2022

(54) SENSOR DEVICE FOR DETECTING A PH CHANGE IN A SOLUTION AND A METHOD FOR FORMING THE SENSOR DEVICE

(71) Applicant: GLOBALFOUNDRIES Singapore Pte. Ltd., Singapore (SG)

(72) Inventors: Lanxiang Wang, Singapore (SG); Ping Zheng, Singapore (SG); Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 875 days.

(21) Appl. No.: 16/163,669

(22) Filed: Oct. 18, 2018

(65) Prior Publication Data
US 2020/0124565 A1    Apr. 23, 2020

(51) Int. Cl.
*G01N 27/414* (2006.01)
*H01L 29/786* (2006.01)
*H01L 21/84* (2006.01)

(52) U.S. Cl.
CPC ......... *G01N 27/4145* (2013.01); *H01L 21/84* (2013.01); *H01L 29/78648* (2013.01)

(58) Field of Classification Search
None
See application file for complete search history.

(56) References Cited

U.S. PATENT DOCUMENTS

| | | | |
|---|---|---|---|
| 7,948,015 B2* | 5/2011 | Rothberg | H01L 29/78 257/253 |
| 8,293,616 B2* | 10/2012 | Chang | H01L 29/66636 438/405 |
| 8,940,569 B2 | 1/2015 | Bedell et al. | |
| 10,495,603 B1* | 12/2019 | Tan | H01L 29/40111 |
| 10,522,400 B2* | 12/2019 | Kalnitsky | H01L 29/78696 |
| 10,724,983 B2* | 7/2020 | Liu | G01N 27/4148 |
| 10,852,271 B2* | 12/2020 | Chen | G01N 27/4145 |

(Continued)

OTHER PUBLICATIONS

Themistoklis Prodromakis et al., "Exploiting CMOS Technology to Enhance the Performance of ISFET Sensors", IEEE Electron Device Letters, Sep. 2010, pp. 1053-1055, vol. 31, No. 9, IEEE.

(Continued)

*Primary Examiner* — Brian R Gordon
(74) *Attorney, Agent, or Firm* — Viering Jentschura & Partner MBB

(57) ABSTRACT

A sensor device includes a substrate, first and second source regions, first and second drain regions, first and second channel regions, and first and second gate structures disposed over the first and second channel regions respectively. The source regions and drain regions are at least partially disposed within the substrate. The second gate structure includes first and second gate elements, and a resistance region configured to provide a resistance to a second current flow through the second channel region. In use, the first gate structure may receive a solution, and a change in pH in the solution changes a first current flow through the first channel region. In turn, the second current flow through the second channel region changes to compensate for the change in the first current flow to maintain a constant current flow through the sensor device.

18 Claims, 15 Drawing Sheets

(56) References Cited

U.S. PATENT DOCUMENTS 11,107,927 B2 * 8/2021 Jang .................. H01L 29/78648
11,231,451 B2 * 1/2022 Bolander ........... G01R 31/2829

OTHER PUBLICATIONS

Peter Kurzweil, "Metal Oxides and Ion-Exchanging Surfaces as pH Sensors in Liquids: State-of-the-Art and Outlook", Sensors 2009, 9, pp. 4955-4985, ISSN 1424-8220.

Xiwei Huang et al., "A 64×64 1200fps CMOS Ion-Image Sensor with Suppressed Fixed-Pattern-Noise for Accurate High-throughput DNA Sequencing", 2014 Symposium on VLSI Circuits Digest of Technical Papers, 2014, IEEE.

Y. -J. Huang et al., "High Performance Dual-Gate ISFET with Non-ideal Effect Reduction Schemes in a SOI-CMOS Bioelectrical SoC", IEDM15, 2015, p. 29.2.1-29.2.4, IEEE.

Jonghyun Go et al., "Coupled Heterogeneous Nanowire-Nanoplate Planar Transistor Sensors for Giant (>10 V/pH) Nernst Response", ACS Nano, 2012, pp. 5972-5979, vol. 6, No. 7.

\* cited by examiner

SENSOR DEVICE FOR DETECTING A PH CHANGE IN A SOLUTION AND A METHOD FOR FORMING THE SENSOR DEVICE

TECHNICAL FIELD

The present disclosure relates generally to sensor devices for detecting a pH change in a solution and methods for forming the sensor devices.

BACKGROUND

Sensors are often used in biomedical processes for detecting pH changes in a solution. An example of such a biomedical process is DNA sequencing where pH changes in a solution are used to sense ions produced by DNA polymerase synthesis.

Prior art sensors for detecting pH changes in a solution include ion-sensitive field-effect transistors (ISFETs) which may include an open-gate structure having a sensitivity up to the Nernst limit (60 mV/pH) or a floating-gate structure. In some ISFETs, the pH changes in the solution are monitored by a sensing member (including, for example, silicon oxide ($SiO_2$), silicon nitride ($Si_3N_4$) or aluminium oxide ($Al_2O_3$)) and are converted to electrical signals.

FIG. 1A shows a top view of a prior art sensor 100 in the form of a coupled ISFET and FIG. 1B shows a cross-sectional view of the prior art sensor 100. As shown in FIGS. 1A-1B, the prior art sensor 100 includes a first transistor 102 and a second transistor 104. The first transistor 102 includes a nano-plate 106 having a gate structure 108 in contact with a solution 110. The gate structure 108 includes a sensing element and a gate oxide layer. The second transistor 104 includes a nanowire 112 having a gate electrode 114 over a gate oxide layer 113. In use, the drain regions 116/118 of the first and second transistors 102, 104 are electrically coupled to a common voltage supply $V_{DD}$, and the source regions 120/122 of the first and second transistors 102, 104 are electrically coupled to a current source 123 configured to provide a constant current flow $I_D$ through the sensor 100. The current flow $I_D$ splits into a first current flow through the first transistor 102 and a second current flow through the second transistor 104. The gate structure 108 of the first transistor 102 is configured to receive a voltage $V_{G,1}$ based on a pH of the solution 110 and is further configured to control the first current flow through the first transistor 102 based on the voltage $V_{G,1}$. When a pH of the solution 110 changes, the voltage $V_{G,1}$ changes and the first current flow through the first transistor 102 changes. To maintain the combined current flow $I_D$ constant, the second current flow through the second transistor 104 changes to compensate for the change in the first current flow through the first transistor 102. This in turns changes the voltage $V_{G,2}$ at the gate electrode 114 of the second transistor 104. The pH changes in the solution 110 are detected based on the amount of change in $V_{G,2}$ to maintain the constant combined current flow $I_D$.

FIG. 1C shows an alternative transistor 104a that may be used to replace the second transistor 104 in the prior art sensor 100. As shown in FIG. 1C, the alternative transistor 104a includes a gate 124 disposed over a channel region 126 between a source region 128 and a drain region 130. The length of the channel region 126 may be denoted as $L_{2,print,100}$. The channel, source and drain regions 126, 128, 130 are within a substrate 132 which is in turn within a buried oxide layer (BOX) 134. The source and drain regions 128, 130 have an n-type conductivity and the substrate 132 has a p-type conductivity. In use, the sensor 100 operates in the same manner as described above.

Although prior art sensors such as sensor 100 are capable of detecting pH changes in a solution, it would be useful to further improve the sensitivity of the sensors. One way to achieve higher sensitivities is to scale up some dimensions of the sensors but this can cause an undesirable increase in the sensor sizes.

SUMMARY

According to a first aspect of the present invention, there is provided a sensor device. The sensor device may include a substrate, a first semiconductor structure, and a second semiconductor structure. The first semiconductor structure may include a first source region at least partially disposed within the substrate, a first drain region at least partially disposed within the substrate, a first channel region between the first source region and the first drain region, and a first gate structure disposed over the first channel region. The first gate structure may be configured to receive a solution and a change in pH in the solution may change a first current flow through the first channel region. The second semiconductor structure may include a second source region at least partially disposed within the substrate, a second drain region at least partially disposed within the substrate, a second channel region disposed between the second source region and the second drain region, and a second gate structure disposed over the second channel region. The second gate structure may include a first gate element, a second gate element, and a resistance region. The resistance region may be configured to provide a resistance to a second current flow through the second channel region. The sensor device may be configured such that when the first current flow through the first channel region changes due to the change in pH in the solution, the second current flow through the second channel region changes to compensate for the change in the first current flow through the first channel region to maintain a constant current flow through the sensor device.

Providing the resistance region may help to electrically increase the effective length of the second channel region of the second semiconductor structure. In turn, the sensitivity gain and sensitivity of the sensor device to changes in pH in the solution may increase, and the saturation drain current of the second channel region may decrease. Providing the resistance region requires negligible additional manufacturing costs and therefore, and a higher sensitivity can be obtained at negligible costs.

According to a second non-limiting aspect of the present invention, a sensor device may include a substrate and a semiconductor structure including a source region at least partially disposed within the substrate, a drain region at least partially disposed within the substrate, a channel region disposed between the source region and the drain region, and a gate structure disposed over the channel region. The gate structure may include a first gate element, a second gate element, and a resistance region. The resistance region may be configured to provide a resistance to a current flow through the channel region. The sensor device may be configured such that when another current flow through another channel region of another semiconductor structure changes due to a change in pH in a solution received by the another semiconductor structure, the current flow through the channel region changes to compensate for the change in the another current flow through the another channel region of the another semiconductor structure to maintain a constant current flow through the sensor device.

According to another non-limiting aspect of the present invention, there is provided a method including obtaining a substrate having a first semiconductor structure formed thereon; wherein the first semiconductor structure may include a first source region which may be at least partially disposed within the substrate, a first drain region which may be at least partially disposed within the substrate, a first channel region which may be between the first source region and the first drain region, and a first gate structure which may be disposed over the first channel region and which may be configured to receive a solution. A change in pH in the solution may change a first current flow through the first channel region. The method may further include forming a second semiconductor structure, wherein forming the second semiconductor structure may include disposing a second source region at least partially within the substrate; disposing a second drain region at least partially within the substrate; disposing a second channel region between the second source region and the second drain region; and disposing a second gate structure over the second channel region, wherein the second gate structure may include a first gate element, a second gate element, and a resistance region. The resistance region may be configured to provide a resistance to a second current flow through the second channel region. The sensor device may be configured such that when the first current flow through the first channel region changes due to a change in pH in the solution, the second current flow through the second channel region changes to compensate for the change in the first current flow through the first channel region to maintain a constant current flow through the sensor device.

According to another non-limiting aspect of the present invention, there is provided a method for using a sensor device. The method may include contacting a first gate structure of a first semiconductor structure with a solution, wherein the first semiconductor structure may include a first source region which may be at least partially disposed within a substrate, a first drain region which may be at least partially disposed within the substrate, a first channel region which may be between the first source region and the first drain region, and the first gate structure may be disposed over the first channel region. The method may further include detecting a change in a second current flow through a second channel region of a second semiconductor structure, the change in the second current flow compensating for a change in a first current flow through the first channel region to maintain a constant current flow through the sensor device, wherein the change in the first current flow through the first channel region may be in response to a change in pH in the solution. The second semiconductor structure may include a second source region which may be at least partially disposed within the substrate, a second drain region which may be at least partially disposed within the substrate, a second channel region which may be disposed between the second source region and the second drain region, and a second gate structure which may be disposed over the second channel region. The second gate structure may include a first gate element, a second gate element and a resistance region, wherein the resistance region may be configured to provide a resistance to the second current flow through the second channel region.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Embodiments of the invention will now be illustrated for the sake of example only with reference to the following drawings, in which.

DETAILED DESCRIPTION

Figure 1A:
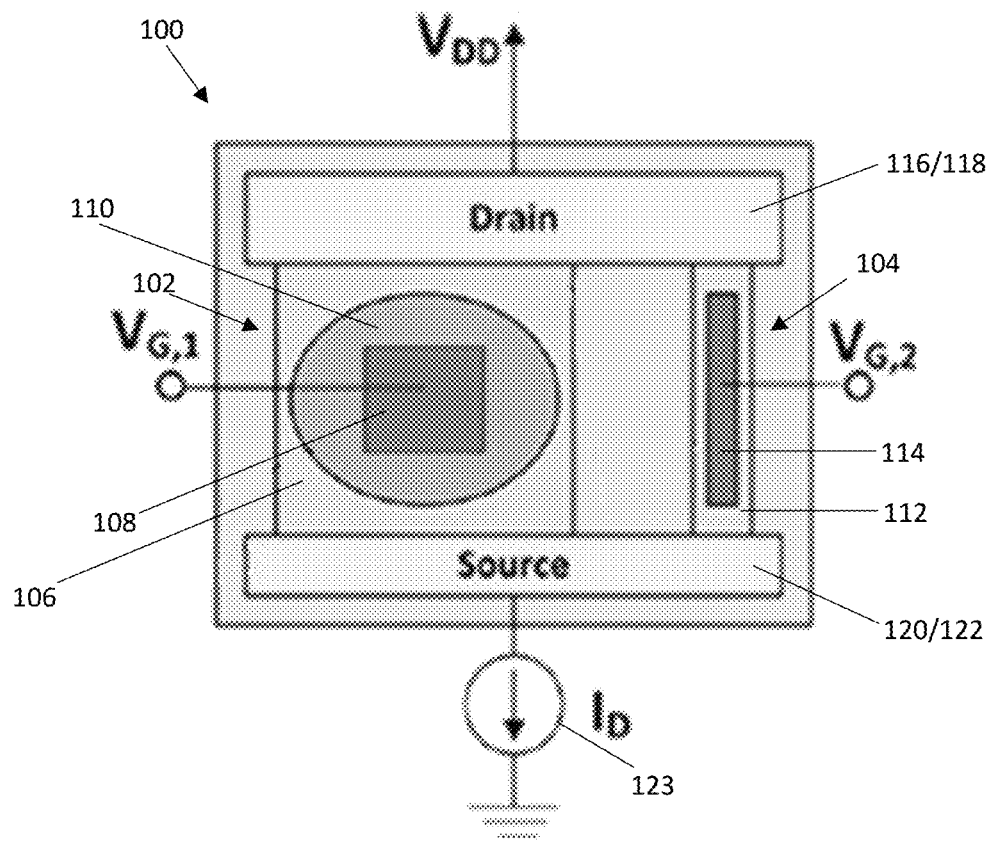
FIGS. 1A-1B respectively show a top view and a cross-sectional view of a prior art sensor for detecting a change in pH in a solution.
Figure 1B:
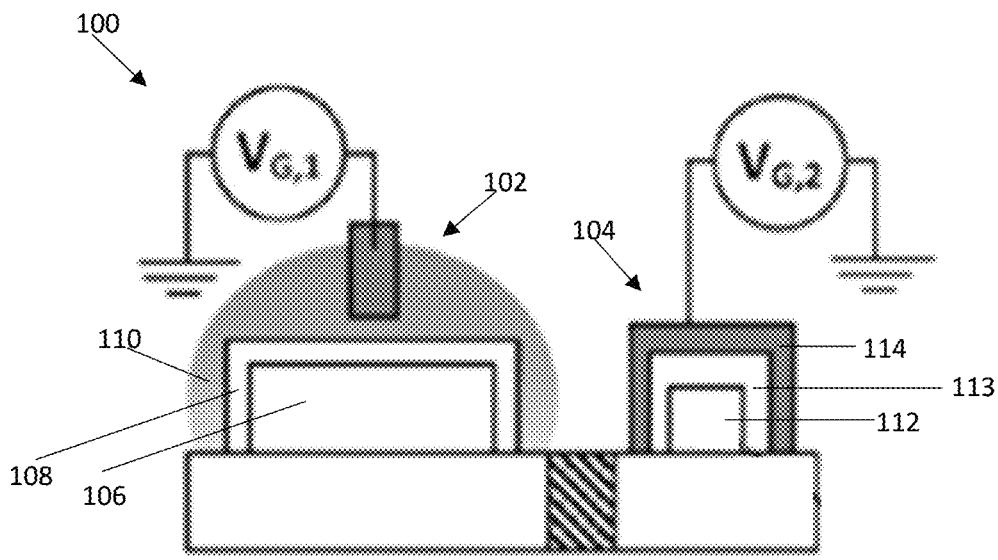

The embodiments generally relate to devices, such as semiconductor devices. More particularly, some embodiments relate to sensor devices employed to detect changes in pH in a solution. The sensor devices can be used as biosensors and can incorporated into, for example, medical devices for measuring a change in pH, DNA sequencing, and/or applications related thereto. The sensor devices may be used for 0.18 um and below technology in a non-limiting embodiment, such as in fully depleted silicon-on-insulators (FD-SOI) and fin field-effect transistors (FINFET).

According to various non-limiting embodiments, a sensor device may include a substrate. The sensor device may further include a first semiconductor structure which may include a first source region which may be at least partially disposed within the substrate, a first drain region which may be at least partially disposed within the substrate, a first channel region which may be between the first source region and the first drain region and a first gate structure which may be disposed over the first channel region. The first gate structure may be configured to receive a solution and a change in pH in the solution may change a first current flow through the first channel region. The sensor device may further include a second semiconductor structure which may include a second source region which may be at least partially disposed within the substrate, a second drain region which may be at least partially disposed within the substrate, a second channel region which may be disposed between the second source region and the second drain region; and a second gate structure which may be disposed over the second channel region. The second gate structure may include a first gate element, a second gate element, and a resistance region. The resistance region may be configured to provide a resistance to a second current flow through the second channel region. The sensor device may be configured such that when the first current flow through the first channel region changes due to the change in pH in the solution, the second current flow through the second channel region changes to compensate for the change in the first current flow through the first channel region to maintain a constant current flow through the sensor device.

According to various non-limiting embodiments, a sensor device may include a substrate. The sensor device may further include a semiconductor structure which may include a source region which may be at least partially disposed within the substrate, a drain region which may be at least partially disposed within the substrate, a channel region which may be disposed between the source region and the drain region and a gate structure which may be disposed over the channel region. The gate structure may include a first gate element, a second gate element, and a resistance region. The resistance region may be configured to provide a resistance to a current flow through the channel region. The sensor device may be configured such that when another current flow through another channel region of another semiconductor structure changes due to a change in pH in a solution received by the another semiconductor structure, the current flow through the channel region changes to compensate for the change in the another current flow through the another channel region of the another semiconductor structure to maintain a constant current flow through the sensor device.

According to various non-limiting embodiments, the resistance region may include a spacer region.

According to various non-limiting embodiments, the spacer region may include a first spacer element laterally adjacent to the first gate element and a second spacer element laterally adjacent to the second gate element.

According to various non-limiting embodiments, the first spacer element may contact the second spacer element.

According to various non-limiting embodiments, a space may be arranged between the first spacer element and the second spacer element.

According to various non-limiting embodiments, the second semiconductor structure may have a serpentine shape.

According to various non-limiting embodiments, the first source region and the first drain region may have a conductivity type that is the same as the second source region and the second drain region.

According to various non-limiting embodiments, the first source region and the first drain region may have a n-type conductivity, and the second source region and the second drain region may have an n-type conductivity.

According to various non-limiting embodiments, a method for forming a sensor device may include obtaining a substrate having a first semiconductor structure formed thereon; wherein the first semiconductor structure may include a first source region which may be at least partially disposed within the substrate, a first drain region which may be at least partially disposed within the substrate, a first channel region which may be at least partially disposed between the first source region and the first drain region, and a first gate structure which may be disposed over the first channel region and which may be configured to receive a solution. A change in pH in the solution may change a first current flow through the first channel region. The method may further include forming a second semiconductor structure, wherein forming the second semiconductor structure may include disposing a second source region at least partially within the substrate; disposing a second drain region at least partially within the substrate; disposing a second channel region between the second source region and the second drain region; and disposing a second gate structure over the second channel region. The second gate structure may include a first gate element, a second gate element, and a resistance region; wherein the resistance region may be configured to provide a resistance to a second current flow through the second channel region; and wherein the sensor device may be configured such that when the first current flow through the first channel region changes due to a change in pH in the solution, the second current flow through the second channel region changes to compensate for the change in the first current flow through the first channel region to maintain a constant current flow through the sensor device.

According to various non-limiting embodiments, disposing the second gate structure over the second channel region may include forming the first gate element; forming the second gate element; and forming a spacer region between the first and second gate elements.

According to various non-limiting embodiments, forming the spacer region between the first and second gate elements may include forming a first spacer element laterally adjacent to the first gate element; and forming a second spacer element laterally adjacent to the second gate element and in contact with the first spacer element.

According to various non-limiting embodiments, forming the spacer region between the first and second gate elements may include forming a first spacer element laterally adjacent to the first gate element; and forming a second spacer element laterally adjacent to the second gate element with a space arranged between the first spacer element and the second spacer element.

According to various non-limiting embodiments, a method for using a sensor device may include contacting a first gate structure of a first semiconductor structure with a solution, wherein the first semiconductor structure may include a first source region which may be at least partially disposed within a substrate, a first drain region which may be at least partially disposed within the substrate, a first channel region which may be between the first source region and the first drain region, and wherein the first gate structure may be disposed over the first channel region. The method may further include detecting a change in a second current flow through a second channel region of a second semiconductor structure, the change in the second current flow compensating for a change in a first current flow through the first channel region to maintain a constant current flow through the sensor device, wherein the change in the first current flow through the first channel region may be in response to a change in pH in the solution, wherein the second semiconductor structure may include a second source region which may be at least partially disposed within the substrate, a second drain region which may be at least partially disposed within the substrate, a second channel region which may be disposed between the second source region and the second drain region, and a second gate structure which may be disposed over the second channel region. The second gate structure may include a first gate element, a second gate element and a resistance region, wherein the resistance region may be configured to provide a resistance to the second current flow through the second channel region.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Figure 2:
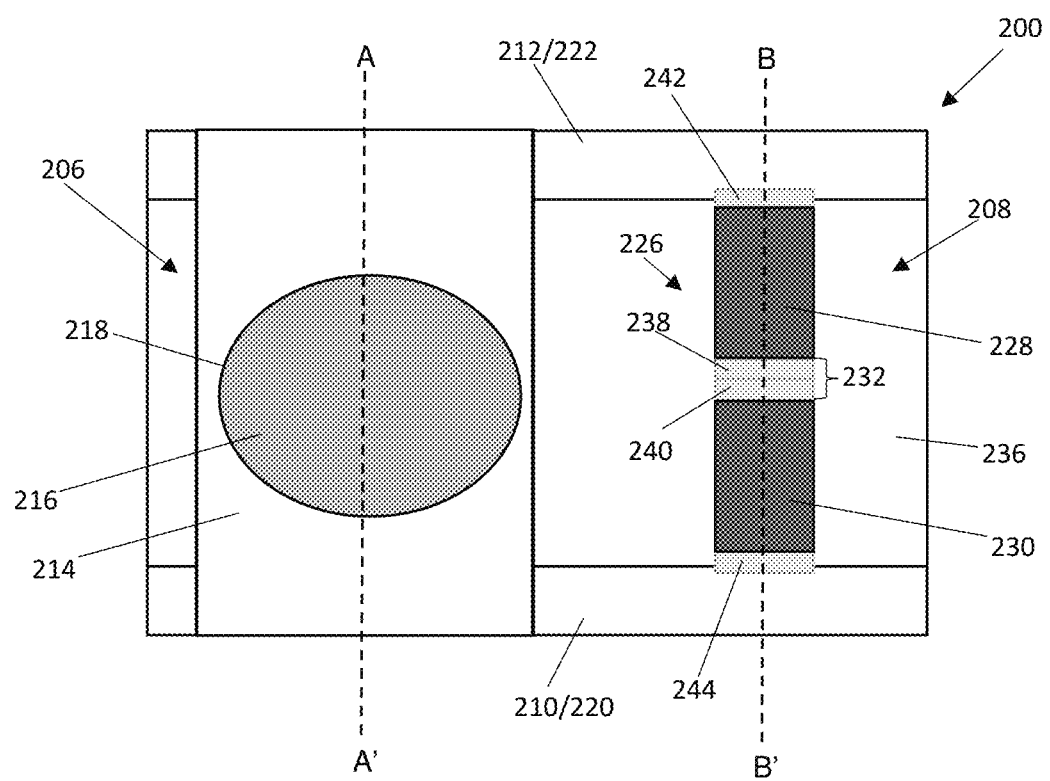
FIG. 2 shows a top view of a sensor device for detecting a change in pH in a solution according to a non-limiting embodiment of the present invention.
Figure 3:
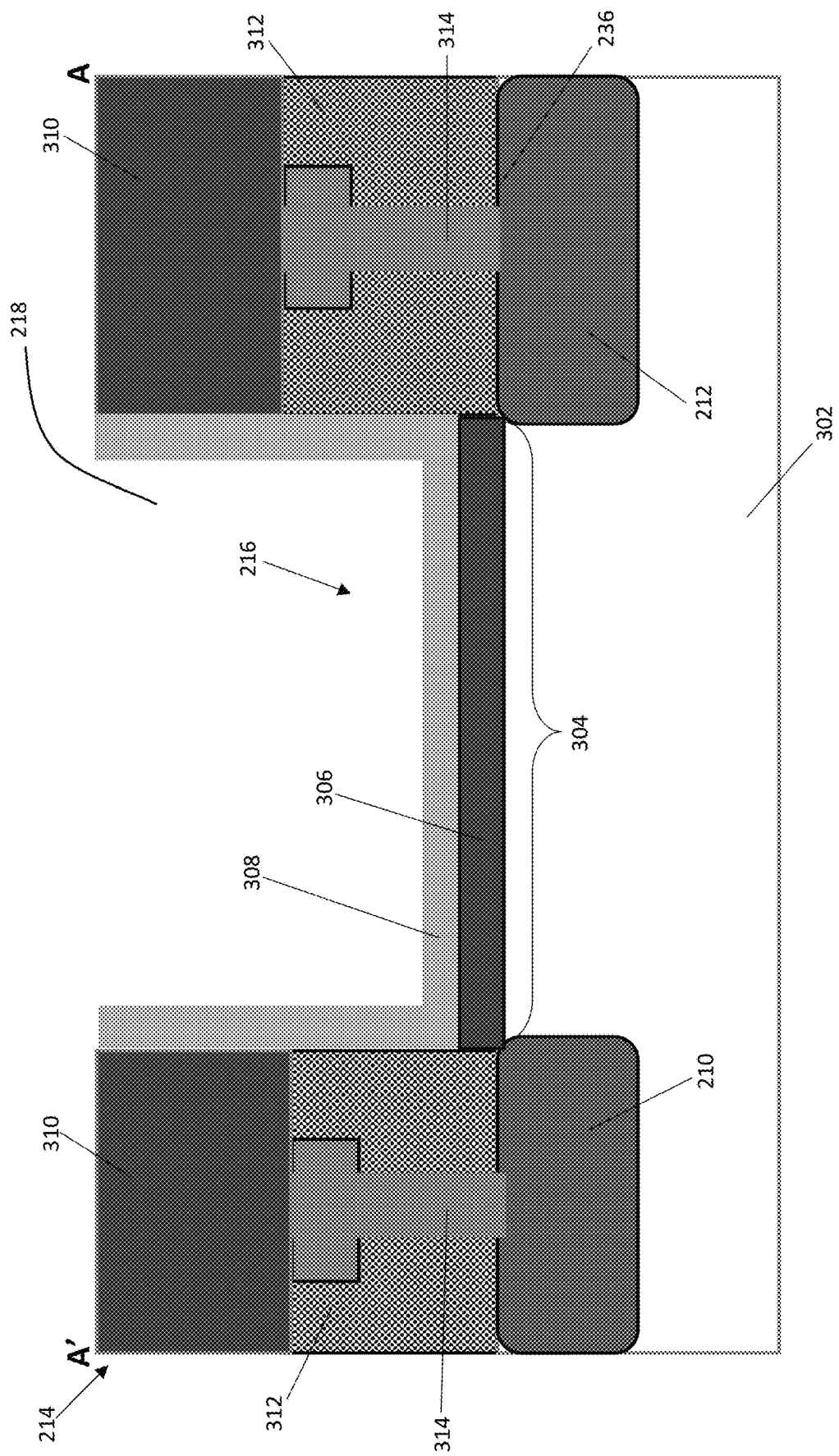
FIG. 3 shows a cross-sectional view of the sensor device of FIG. 2 along the line A-A'.

FIG. 2 shows a top view of a sensor device 200 for detecting a change in pH in a solution according to a non-limiting embodiment of the present invention. The sensor device 200 may be referred to as a coupled ion-sensitive field effect transistor (ISFET) sensor in a non-limiting embodiment. The sensor device 200 may include a first semiconductor structure 206 and a second semiconductor structure 208, which may be in the form of a first transistor and a second transistor respectively. FIG. 3 shows a cross-sectional view of the sensor device 200 (in particular, the first semiconductor structure 206) along the line A-A', whereas FIG. 4 shows a cross-sectional view of the sensor device 200 (in particular, the second semiconductor structure 208) along the line B-B'.

Figure 4:
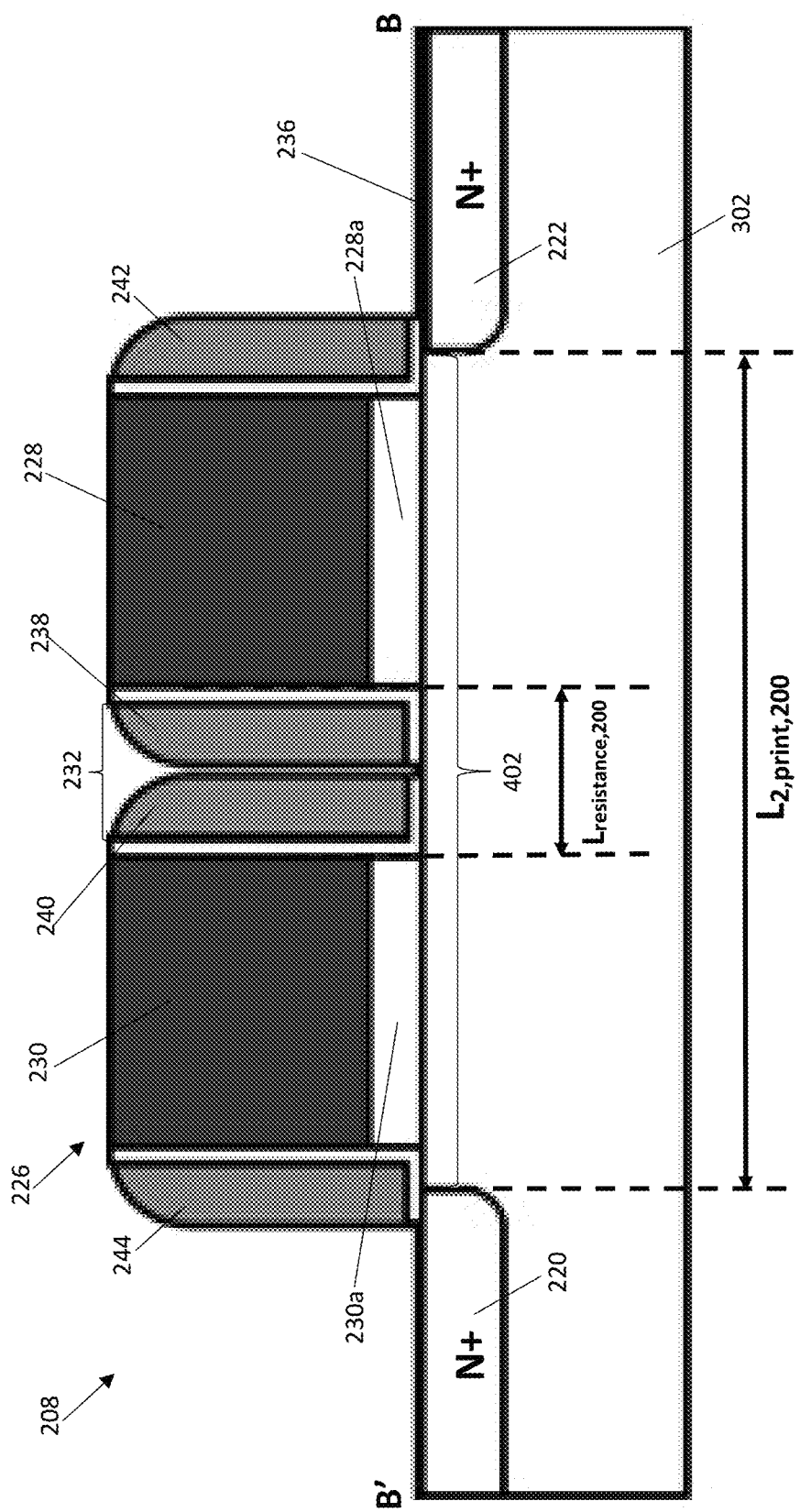
FIG. 4 shows a cross-sectional view of the sensor device of FIG. 2 along the line B-B'.

Referring to FIG. 3 and FIG. 4, the sensor device 200 may include a substrate 302 disposed beneath a surface 236 of the sensor device 200. In a non-limiting embodiment, the substrate 302 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI), silicon germanium substrates, or combinations thereof, and the like. Substrate 302 may in addition or instead include various isolations, dopings and/or device features. The substrate 302 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), indium antimonide (InSb), or combinations thereof; an alloy semiconductor including GaAsP, AlInAs, GaInAs, GaInP, GaInAsP, silicon germanium (SiGe), germanium tin (GeSn), silicon germanium tin (SiGeSn) or combinations thereof. Other types of materials as known to those skilled in the art may also be useful for forming the substrate 302.

The first semiconductor structure 206 may include a first source region 210, a first drain region 212 and a first channel region 304 beneath the surface 236 of the sensor device 200, and a body 214 and a first gate structure 216 above the surface 236 of the sensor device 200. The first source region 210 and the first drain region 212 may be at least partially disposed within the substrate 302. The first channel region 304 may be a portion of the substrate 302 and may be between the first source region 210 and the first drain region 212. The first gate structure 216 may be disposed over the first channel region 304. In a non-limiting embodiment, a change in pH in the solution may affect the conductance modulation of the first gate structure 216. The first gate structure 216 may be in the form of an open-gate structure. For example, the first gate structure 216 may include a gate oxide layer 306 and a sensing element 308. The body 214 may include a cavity 218 configured to receive the solution and the sensing element 308 may be disposed within the cavity 218, so that a change in pH in the solution changes a voltage applied to the first gate structure 216, e.g. the sensing element 308, which in turn changes a first current flow through the first channel region 304. The sensing element 308 may include a sensing membrane or a stack of sensing membranes (which may be formed of for example silicon oxide, silicon nitride, aluminium oxide, combinations thereof, or other material(s) as known to those skilled in the art). In a non-limiting embodiment, the body 214 may further include a top passivation layer 310, an inter-layer dielectric layer/inter-metal dielectric layer 312 and backend-of-line (BEOL) metals 314. The first semiconductor structure 206 may optionally be disposed within a buried oxide layer (BOX). In other embodiments, the body 214 may include a plate, e.g. a nano-plate or other structures as known to those skilled in the art. The gate structure 216 may alternatively be in the form of a floating-gate structure including a cavity for receiving the solution, an intermediate layer, for example, a passivation layer beneath the cavity to detect changes in the amount and/or type of ions of the solution, and a sensing element disposed beneath the passivation layer. Other types of structures as known to those skilled in the art may also be useful for forming the first gate structure 216.

The second semiconductor structure 208 may include a second source region 220, a second drain region 222 and a second channel region 402 beneath the surface 236 of the sensor device 200, and a second gate structure 226 above the surface 236 of the sensor device 200. The second source region 220 and the second drain region 222 may be at least partially disposed within the substrate 302. The second channel region 402 may be a portion of the substrate 302 and may be between the second source region 220 and the second drain region 222. The second gate structure 226 may be disposed over the second channel region 402. In a non-limiting embodiment, the second gate structure 226 may include a multi-finger gate configuration. For example, the second gate structure 226 may include a first gate element 228, a second gate element 230 and a resistance region 232. The first gate element 228, second gate element 230 and resistance region 232 may be arranged laterally adjacent to each other, with the resistance region 232 between the first and second gate elements 228, 230. The first and second gate elements 228, 230 may be formed of a conductive material, such as polysilicon in a non-limiting embodiment, but other conductive materials, such as metals or alloys for example TiN, TaN, W, and combinations thereof would be recognized by those skilled in the art. The first and second gate elements 228, 230 may include a gate oxide layer 228a, 230a respectively which may be formed of high-k dielectrics, such as $HfO_2$ in a non-limiting example. The resistance region 232 may be configured to provide a resistance to a second current flow through the second channel region 402. The resistance region 232 may include a spacer region in a non-limiting embodiment. The spacer region may, for example, include a first spacer element 238 laterally adjacent to the first gate element 228 and a second spacer element 240 laterally adjacent to the second gate element 230. The first spacer element 238 may contact the first gate element 228, whereas the second spacer element 240 may contact the second gate element 230. Further, the first spacer element 238 may contact the second spacer element 240. A third spacer element 242 may be disposed laterally adjacent to the first gate element 228 and in contact with the first gate element 228, such that the first gate element 228 is between the first and third spacer elements 238, 242. A fourth spacer element 244 may be disposed laterally adjacent to the second gate element 230 and in contact with the second gate element 230, such that the second gate element 230 is between the second and fourth spacer elements 240, 244.

In a non-limiting embodiment, the first and second source regions 210, 220 may be integrally formed as a single source region 210/220 and the first and second drain regions 212, 222 may be integrally formed as a single drain region 212/222 (for example, as shown in FIG. 2). Integrally forming the source regions 210, 220 and/or integrally forming the drain regions 212, 222 may reduce the number of manufacturing steps, in turn reducing manufacturing costs. However, the first and second source regions 210, 220 may be distinct regions, or the first and second drain regions 212, 222 may be distinct regions in an alternative embodiment. Metal contacts (not shown in the figures) may be disposed above the surface 236 of the sensor device 200 and above the single source region 210/220, single drain region 212/222, and first and second gate elements 228, 230 to electrically couple these regions 210/220, 212/222 and gate elements 228, 230 to external components when the sensor device 200 is in use in a non-limiting embodiment.

The substrate 302, the first source and drain regions 210, 212, the second source and drain regions 220, 222, may include one or more dopants. In one non-limiting embodiment, the first source and drain regions 210, 212 and the second source and drain regions 220, 222 have the same doping concentration (i.e. the same concentration of dopants). Alternatively, the doping concentrations of the source and drain regions 210, 212, 220, 222 may be different from each other. The doping concentrations of the source and drain regions 210, 212, 220, 222 may be higher than the doping concentration of the substrate 302. In a non-limiting example, the doping concentration of the substrate 302 may be about $1E-16$ $cm^{-3}$, the doping concentrations of the first source and drain regions 210, 212 and the second source and drain regions 220, 222 may range from about $1E19$ $cm^{-3}$ to about $1E20$ $cm^{-3}$. In some non-limiting embodiments, the first semiconductor structure 206 may include a first body region and the second semiconductor structure 208 may include a second body region. The first and second body regions may have a conductivity type different from the conductivity type of the source and drain regions 210, 212, 220, 222, and may also include one or more dopants. In one non-limiting example, the doping concentrations of the body regions may range from about $1E17$ $cm^{-3}$ to about $1E18$ $cm^{-3}$.

The first source region 210 and the first drain region 212 may have a conductivity type that is the same as the second source region 220 and the second drain region 222. The first and second source regions 210, 220, and the first and second drain regions 212, 222 may, for example have a first conductivity type (e.g. p-type conductivity or n-type conductivity), in other words, include dopants having a first conductivity type (e.g. p-type dopants or n-type dopants). The substrate 302 may, for example, have a second conductivity type different from the first conductivity type (e.g. p-type conductivity when the source and drain regions 210, 220, 212, 222 have the n-type conductivity or n-type conductivity when the source and drain regions 210, 220, 212, 222 have the p-type conductivity). For example, the first and second semiconductor structures 206, 208 may both include a p-type metal oxide semiconductor (PMOS) or the first and second semiconductor structures 206, 208 may both include an n-type metal oxide semiconductor (NMOS). In one example, the implant material for the substrate 302, the first source and drain regions 210, 212, the second source and drain regions 220, 222, may be the same implant material, for example, an epitaxial silicon material in a non-limiting embodiment. The p-type material may be or include, but is not limited to epitaxial silicon germanium and/or the n-type material may be or include, but is not limited to doped silicon material comprising n-type dopants. P-type dopants can for example, include but are not limited to boron (B), aluminium (Al), indium (In) or a combination thereof, while n-type dopants can include carbon (C), phosphorus (P), arsenic (As), antimony (Sb) or a combination thereof. Other types of implant materials and dopants as known to those skilled in the art may also be useful for forming the substrate 302, the first source and drain regions 210, 212, and the second source and drain regions 220, 222.

The first gate element 228 may at least partially overlap with the second drain region 222, and the second gate element 230 may at least partially overlap with the second source region 230 in a non-limiting embodiment. Similarly, the third spacer element 242 may at least partially overlap with the second drain region 222 and the fourth spacer element 244 may at least partially overlap with the second source region 220 in a non-limiting embodiment. However, the third spacer element 242 and the fourth spacer element 244 may be absent in an alternative embodiment. The spacer elements 238, 240, 242, 244 may be etched and may include an insulating material. For example, the insulating material may be in the form of dielectric spacers in a non-limiting embodiment and/or may include, but is not limited to, silicon oxide, silicon nitride, silicon oxynitride, combinations thereof, or other types of dielectric materials, or multiple layers of insulating materials. Other materials as known to those skilled in the art may also be useful for forming the spacer elements 238, 240, 242, 244.

The spacer elements 238, 240, 242, 244 may have the same height or may be of different heights, and the gate elements 228, 230 may have the same height or may be of different heights. The heights of one or more of the spacer elements 238, 240, 242, 244 may be equal to the heights of one or both of the gate elements 228, 230. The spacer elements 238, 240, 242, 244 may have the same length or may be of different lengths, and the gate elements 228, 230 may have the same length or may be of different lengths. The lengths of the gate elements 228, 230 may be greater than the length of any one of the spacer elements 238, 240, 242, 244. Each spacer element 238, 240, 242, 244 may include a top portion and a bottom portion, with the top portion narrower than the bottom portion. Each spacer element 238, 240, 242, 244 may have a length ranging from about 0.5 nm to about 50 nm, for example about 5 nm-about 10 nm in a non-limiting embodiment, alternatively from about 0.1 nm to about 90 nm. Each gate element 228, 230 may have a height ranging from about 50 nm to about 500 nm, for example about 30 nm in a non-limiting embodiment, alternatively from about 10 nm to about 900 nm. Each gate element 228, 230 may have a length ranging from about 10 nm to about 5 um, for example about 80 nm in a non-limiting embodiment, alternatively from about 5 nm to about 10 um. The actual length of the second channel region 402 may be denoted as $L_{2,print,200}$ as shown in FIG. 4 and may range from about 5 nm to about 5 um, for example about 80 nm in a non-limiting embodiment, alternatively from about 1 nm to about 10 um. The length of the resistance region 232 may be denoted as $L_{resistance\ region,200}$ as shown in FIG. 4 and may range from about 5 nm to about 500 nm, for example about 15 nm-about 20 nm in a non-limiting embodiment, alternatively from about 1 nm to about 900 nm. Alternatively, a length ratio of the second channel region 402 to the resistance region 232 may range from about 5:1 to about 4:1.

Figure 5:
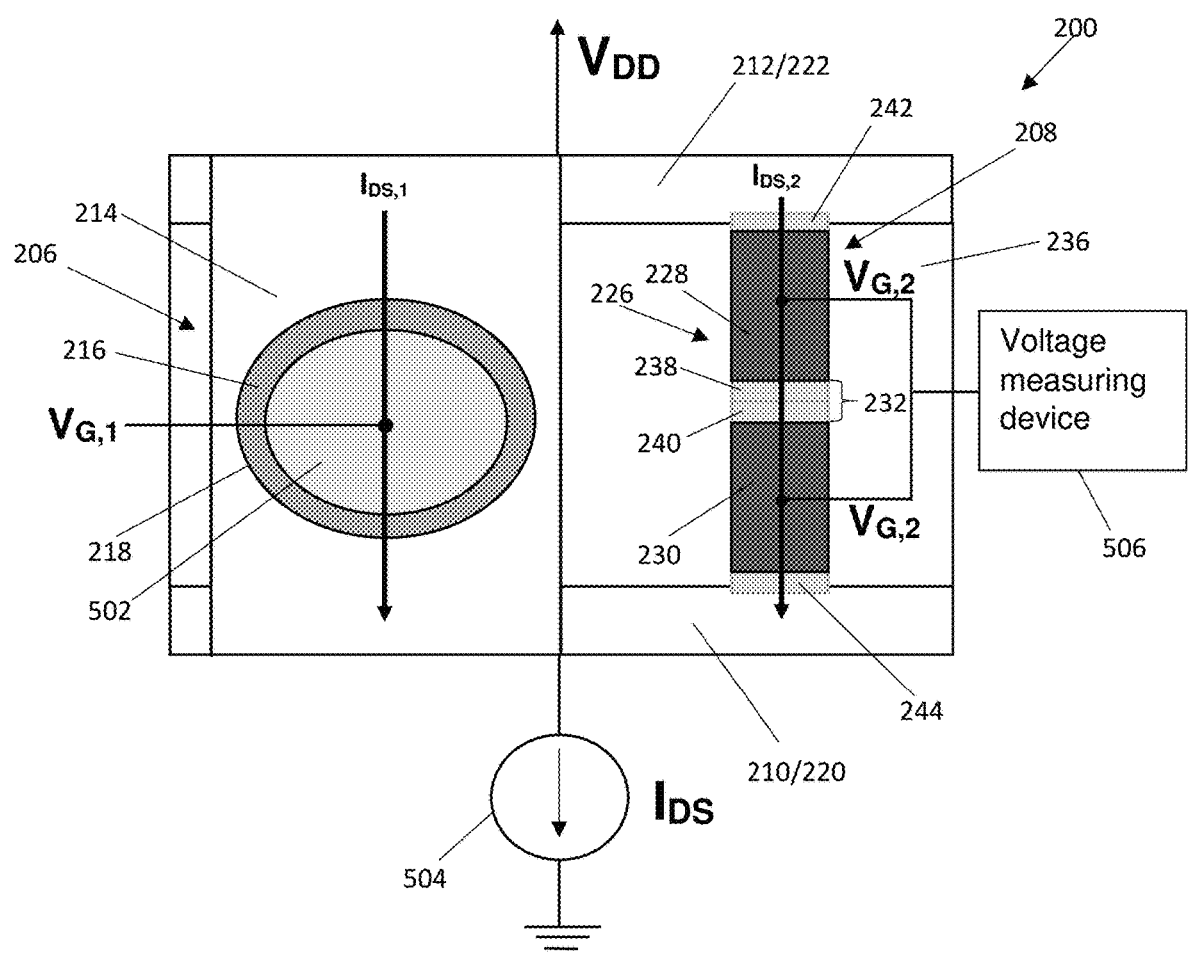
FIG. 5 shows a top view of the sensor device of FIG. 2 in use.

FIG. 5 shows a top view of the sensor device 200 when the sensor device 200 is in use. In one example, the first semiconductor structure 206 may operate as a sensing transistor and the second semiconductor structure 208 may operate as an amplifying transistor in a non-limiting embodiment. The first and second semiconductor structures 206, 208 may operate in an accumulation mode or an inversion mode. In use, the first and second drain regions 212, 222 may be biased at a voltage $V_{DD}$; whereas, the first and second source regions 210, 220 may be connected to a current source 504 configured to provide a current flow $I_{DS}$ through the sensor device 200. The current source 504 may in turn be connected to ground. The first gate structure 216 of the first semiconductor structure 206 may be contacted with the solution 502. For example, the sensing element 308 may be contacted with the solution 502, so that a change in pH in the solution 502 changes a voltage applied to the first gate structure 216, e.g. the sensing element 308.

The current flow $I_{DS}$ provided by the current source 504 may split into a first current flow $I_{DS,1}$ through the first semiconductor structure 206, for example, through the first channel region 304 (FIG. 3) and a second current flow $I_{DS,2}$ through the second semiconductor structure 208, for example, through the second channel region 402 (FIG. 4). In other words, current flow $I_{DS}$ passing through the sensor device 200 is a combination of the first and second current flows $I_{DS,1}$, $I_{DS,2}$ in a non-limiting embodiment as described in Equation (1).

$$I_{DS}=I_{DS,1}+I_{DS,2}=\text{constant} \quad (1)$$

By connecting the first and second source regions 210/220 to the current source 504, the sensor device 200 may operate to maintain the current flow $I_{DS}$ constant through the sensor device 200. In other words, the sensor device 200 may compensate for a change in the first current flow $I_{DS,1}$ with a change in the second current flow $I_{DS,2}$ since the current flow $I_{DS}$ passing through the sensor device 200 is a combination of the first and second current flows $I_{DS,1}$, $I_{DS,2}$. For example, the magnitude of the change in the second current flow $I_{DS,2}$ through the second channel region 402 may be equal to the magnitude of the change in the first current flow $I_{DS,1}$ through the first channel region 302 as shown in Equations (2)-(3) below.

$$\Delta I_{DS,1}+\Delta I_{DS,2}=0 \quad (2)$$

$$|\Delta I_{DS,1}|=|\Delta I_{DS,2}| \quad (3)$$

In a non-limiting embodiment, a change in pH in the solution 502 changes the first current flow $I_{DS,1}$ through the first channel region 304. For example, the change in pH in the solution 504 may change a voltage $V_{G,1}$ applied to the first gate structure 216 which may in turn change the first current flow $I_{DS,1}$ through the first channel region 304. The sensor device 200 may be configured such that when the first current flow $I_{DS,1}$ through the first channel region 304 changes due to the change in pH in the solution 502, the second current flow $I_{DS,2}$ through the second channel region 402 changes to compensate for the change in the first current flow $I_{DS,1}$ through the first channel region 304 to maintain a constant current flow through the sensor device 200. For example, to keep the current flow $I_{DS}$ through the sensor device 200 constant, the sensor device 200 may operate to change the second current flow $I_{DS,2}$ through the second channel region 402. This may in turn change a first compensatory gate voltage of the first gate element 228 and a second compensatory gate voltage of the second gate element 230. The changes in the first and second compensatory gate voltages of the first and second gate elements 228, 230 may then be measured by a voltage measuring device 506 to determine the pH changes in the solution 502. In a non-limiting embodiment, the first and second compensatory gate voltages may be equal in magnitude (e.g. equal to $V_{G,2}$). Alternatively, the first and second compensatory gate voltages may differ in magnitude.

In one embodiment, the change in the first current flow $\Delta I_{DS,1}$ through the first semiconductor structure 206 and the change in the second current flow $\Delta I_{DS,2}$ through the second semiconductor structure 208 can be expressed according to Equations (4) and (5) respectively. In Equations (4) and (5), $\mu_1$ and $\mu_2$ are the channel mobility of the first and second semiconductor structures 206, 208 respectively, $C_{OX,1}$ and $C_{OX,2}$ are the gate oxide capacitances of the first and second semiconductor structures 206, 208 respectively, $W_1$ and $W_2$ are the widths of the first and second channel regions 304, 402 respectively, $L_1$ and $L_2$ are the effective lengths of the first and second channel regions 302, 402 respectively, $V_{DS,1}$ and $V_{DS,2}$ are the drain bias of the first and second semiconductor structures 206, 208 respectively and may be equal to $V_{DD}$ as shown in FIG. 5, and $\Delta V_{G,1}$ and $\Delta V_{G,2}$ are the gate bias modulation of the first and second semiconductor structures 206, 208 respectively with $\Delta V_{G,1}$ dependent on pH changes in the solution and $\Delta V_{G,2}$ dependent on changes in the second current flow $I_{DS,2}$ through the second channel region 402.

$$\Delta I_{DS,1} = \mu_1 * C_{OX,1} * (W_1/L_1) * V_{DS,1} * \Delta V_{G,1} \qquad (4)$$

$$\Delta I_{DS,2} = \mu_2 * C_{OX,2} * (W_2/L_2) * V_{DS,2} * \Delta V_{G,2} \qquad (5)$$

The sensitivity gain of the sensor device 200 can be derived from Equations (4) and (5) and is described in Equation (6) below.

$$\text{Sensitivity Gain} = \frac{\Delta V_{G,2}}{\Delta V_{G,1}} = \left(\frac{\mu_1}{\mu_2} \frac{(W/L)_1}{(W/L)_2} \frac{V_{DS,1}}{V_{DS,2}}\right) \frac{C_{OX,1}}{C_{OX,2}} \qquad (6)$$

In a non-limiting embodiment, the second semiconductor structure 208 includes a top-gated structure and the gate oxide capacitance of the first and second semiconductor structures 206, 208 are the same, hence $C_{OX,1}=C_{OX,2}$. Further in this non-limiting embodiment, the channel mobility of the first and second semiconductor structures 206, 208 are also the same (e.g. both the first and second channel regions 302, 402 may be silicon channels), hence $\mu_1=\mu_2$, and the drain bias $V_{DS,1}$, $V_{DS,2}$ of the first and second semiconductor structures 206, 208 are both equal to $V_{DD}$ as shown in FIG. 5. In this non-limiting embodiment, the sensitivity gain can be expressed using Equation (7) below.

$$\text{Sensitivity Gain} = \frac{\Delta V_{G,2}}{\Delta V_{G,1}} = (W_1/W_2) * (L_2/L_1) \qquad (7)$$

The sensitivity of the sensor device 200 may be expressed according to Equation (9) below.

$$\text{Nernst Limit} = \Delta V_{G,1}/\text{pH} = \approx 60\text{mV/pH} \qquad (8)$$

$$\begin{aligned}\text{Sensitivity} &= \Delta V_{G,2} \\ &= (W_1/W_2) * (L_2/L_1) * \Delta V_{G,1} \\ &\approx ((W_1/W_2) * (L_2/L_1) * 60\text{mV})/\text{pH}\end{aligned} \qquad (9)$$

Providing the resistance region 232 may help to increase the effective length $L_2$ of the second channel region 402 of the second semiconductor structure 208. For example, if the actual length of the second channel region 402 is equal to $L_{2,print,200}$ as shown in FIG. 4, the effective length $L_2$ of the second channel region 402 may be equal to $F*L_{2,print,200}$ where F is the channel length gain factor. F may be expressed as Equation (10) as follows. In Equation (10), $I_{DS,2,0}$ is the current flow through the second semiconductor structure 208 if the second semiconductor structure 208 includes the alternative prior art transistor 104a shown in FIG. 1C with $L_{2,print,100}=L_{2,print,200}$.

$$F = I_{DS,2,0}/I_{DS,2} = L_2/L_{2,print,200} > 1 \qquad (10)$$

The change in the second current flow $\Delta I_{DS,2}$ passing through the second channel region 402 may be expressed as a function of F and the actual length $L_{2,print,200}$ of the second channel region 402 as shown in Equation (11) below.

$$\begin{aligned}\Delta I_{DS,2} &= \mu_2 * C_{OX,2} * (W_2/L_2) * V_{DS,2} * \Delta V_{G,2} \\ &= \mu_2 * C_{OX,2} * (W_2/(F*L_{2,print,200})) * V_{DS,2} * \Delta V_{G,2} \\ &= (1/F) * \mu_2 * C_{OX,2} * (W_2/L_{2,print,200}) * V_{DS,2} * \Delta V_{G,2}\end{aligned} \qquad (11)$$

The sensitivity gain of the sensor device 200 may be expressed as a function of F and the actual length $L_{2,print,200}$ of the second channel region 402 as shown in Equation (12) below.

$$\text{Sensitivity Gain} = (W_1/W_2) * (F*L_{2,print,200}/L_1) \qquad (12)$$

Similarly, the sensitivity of the sensor device 200 may be expressed as a function of F and the actual length $L_{2,print,200}$ of the second channel region 402 as shown in Equation (13) below.

$$\begin{aligned}\text{Sensitivity} &\approx ((W_1/W_2) * (F*L_{2,print,200}/L_1) * 60\text{mV})/\text{pH} \\ &= F * ((W_1/W_2) * (L_{2,print,200}/L_1) * 60\text{mV})/\text{pH}\end{aligned} \qquad (13)$$

As shown in Equations (12) and (13), providing the resistance region 232 configured to provide a resistance to the second current flow $I_{DS,2}$ through the second channel region 402 may increase the sensitivity and sensitivity gain of the sensor device 200 by a factor of F>1.

In the above equations, $\mu_1$ and $\mu_2$ may range from about 5 $cm^2V^{-1}s^{-1}$ to about 5000 $cm^2V^{-1}s^{-1}$, for example about 200 $cm^2V^{-1}s^{-1}$ in a non-limiting embodiment, alternatively from about 1 $cm^2V^{-1}s^{-1}$ to about 9000 $cm^2V^{-1}s^{-1}$. $C_{OX,1}$ and $C_{OX,2}$ may depend on the oxide thickness which may range from about 0.5 nm to about 50 nm, for example about 5 nm in a non-limiting embodiment, alternatively from about 0.1 nm to about 90 nm. $W_1$ and $W_2$ may range from about 5 nm to about 5 um, for example $W_1$ may be about 10 um and $W_2$ may be about 100 nm in a non-limiting embodiment, alternatively from about 1 nm to about 9 nm. $V_{DD}$ may range from about 0.5V to about 5V, for example, 0.9V, 1.1V, 1.2V, 3.3V or 5V in a non-limiting embodiment, alternatively from about 0.1V to about 9V. $L_1$ may range from about 5 nm to about 5 um, for example, about 80 nm in a non-limiting embodiment, alternatively from about 1 nm to about 9 um.

In a non-limiting embodiment, the sensor device 200 may be formed by first forming or obtaining the substrate 302 and then, forming the first and second semiconductor structures 206, 208 on the substrate 302. Forming the first semiconductor structure 206 may include disposing the first source region 210 at least partially within the substrate 302, disposing the first drain region 212 at least partially within the substrate 302, disposing the first channel region 304 between the first source region 210 and the first drain region 212 and disposing the first gate structure 216 over the first channel region 304. Forming the second semiconductor structure 208 may include disposing the second source region 220 at least partially within the substrate 302, disposing the second drain region 222 at least partially within the substrate 302, disposing the second channel region 402 between the second source region 220 and the second drain region 222 and disposing the second gate structure 226 over the second channel region 402. The above described order of the steps for the method is only intended to be illustrative, and the steps of the method of the present invention are not limited to the above specifically described order unless otherwise specifically stated.

The first semiconductor structure 206 may be formed using, for example, known processes and techniques. For example, a dummy poly or dielectric may first be formed on an area of the substrate 302. Then the first source and drain regions 210, 212 may be formed. In various embodiments, one or more of a spacer, silicide, inter-layer dielectric (ILD), metal contacts, metal layers and passivation layer may be formed after forming the dummy poly. In various embodiments, the cavity 218 may then be formed by removing the dummy poly. The sensing element 308 may include a sensing membrane or a stack of sensing membranes and may be formed in the cavity 218. Other ways of forming the first semiconductor structure 206 as known to those skilled in the art may also be useful.

Figure 6A:
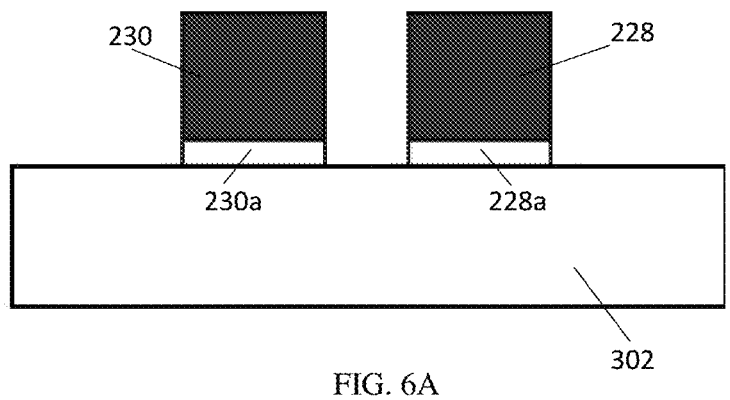
FIGS. 6A-6C show a portion of the sensor device of FIG. 2 during formation of the sensor device.
Figure 6B:
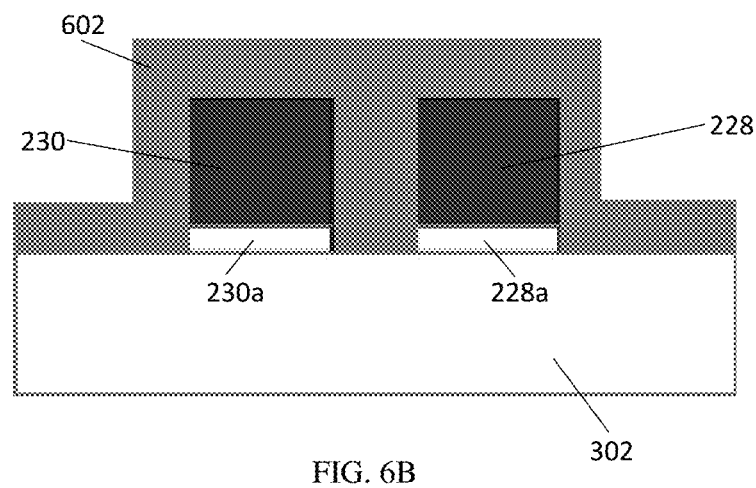
Figure 6C:
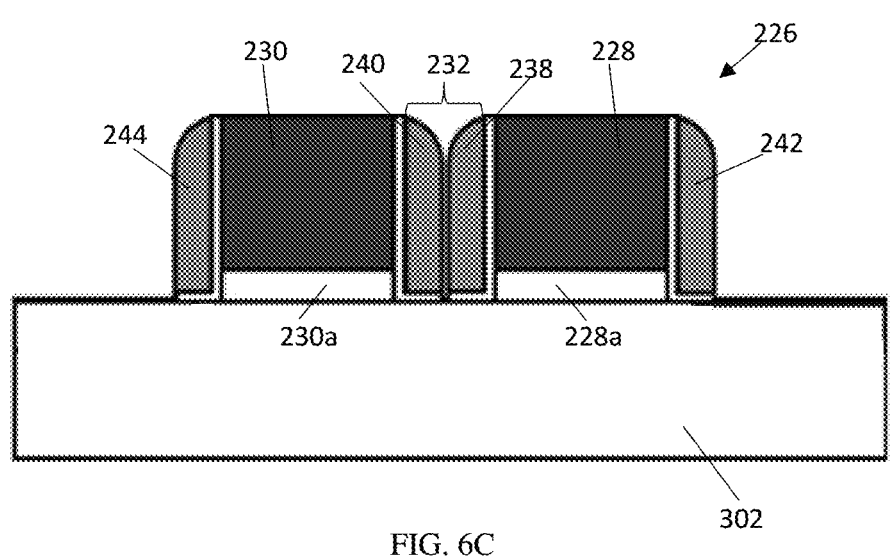

FIGS. 6A-6C show a portion of the sensor device 200 during formation of the second gate structure 226 of the second semiconductor structure 208 according to a non-limiting embodiment of the present invention. FIG. 6A shows the portion of the sensor device 200 after the first and second gate elements 228, 230 are formed on the substrate 302. The gate elements 228, 230 may be formed using, for example, known processes and techniques (e.g. forming polysilicon and a gate resist pattern, and performing gate etching). Referring to FIG. 6B, a layer of dielectric material 602 (which may be, for example, silicon oxide, silicon nitride or silicon oxynitride) may then be deposited over the first and second gate elements 228, 230 and the substrate 302. The layer of dielectric material 602 may then be etched to form the spacer elements 238, 240, 242, 244, thus forming the resistance region 232 and the second gate structure 226.

Figure 7:
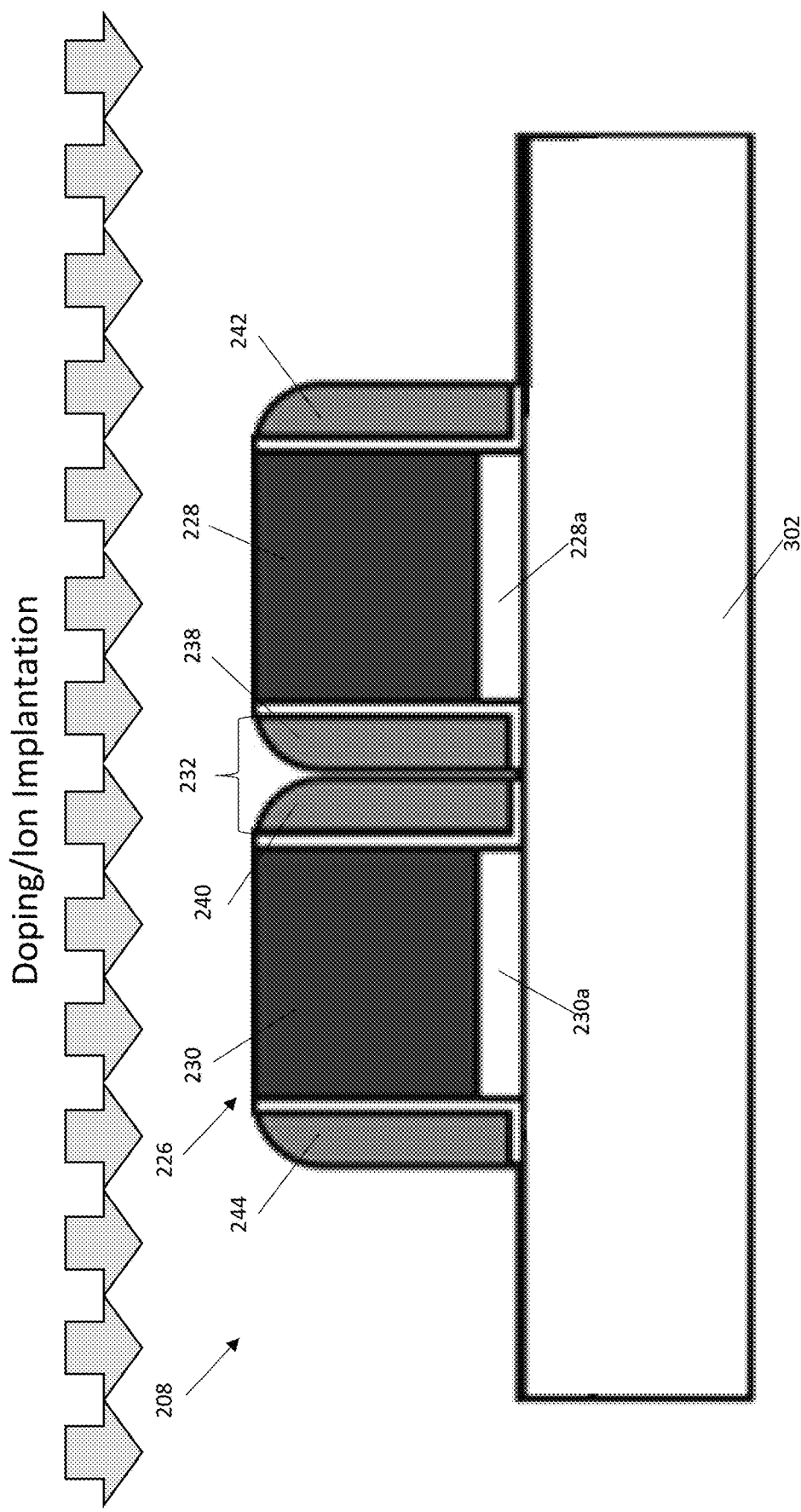
FIG. 7 shows the doping of a portion of the sensor device of FIG. 2.

FIG. 7 shows the doping/ion implantation of the second source and drain regions 220, 222 of the second semiconductor structure 208 in a non-limiting embodiment. In one embodiment as shown in FIG. 7, the resistance region 232 includes a spacer region having first and second spacer elements 238, 240 in contact with each other. This spacer region may block a portion of the second channel region 402 (e.g. the portion beneath the spacer region) from the doping/ion implantation.

Figure 1C:
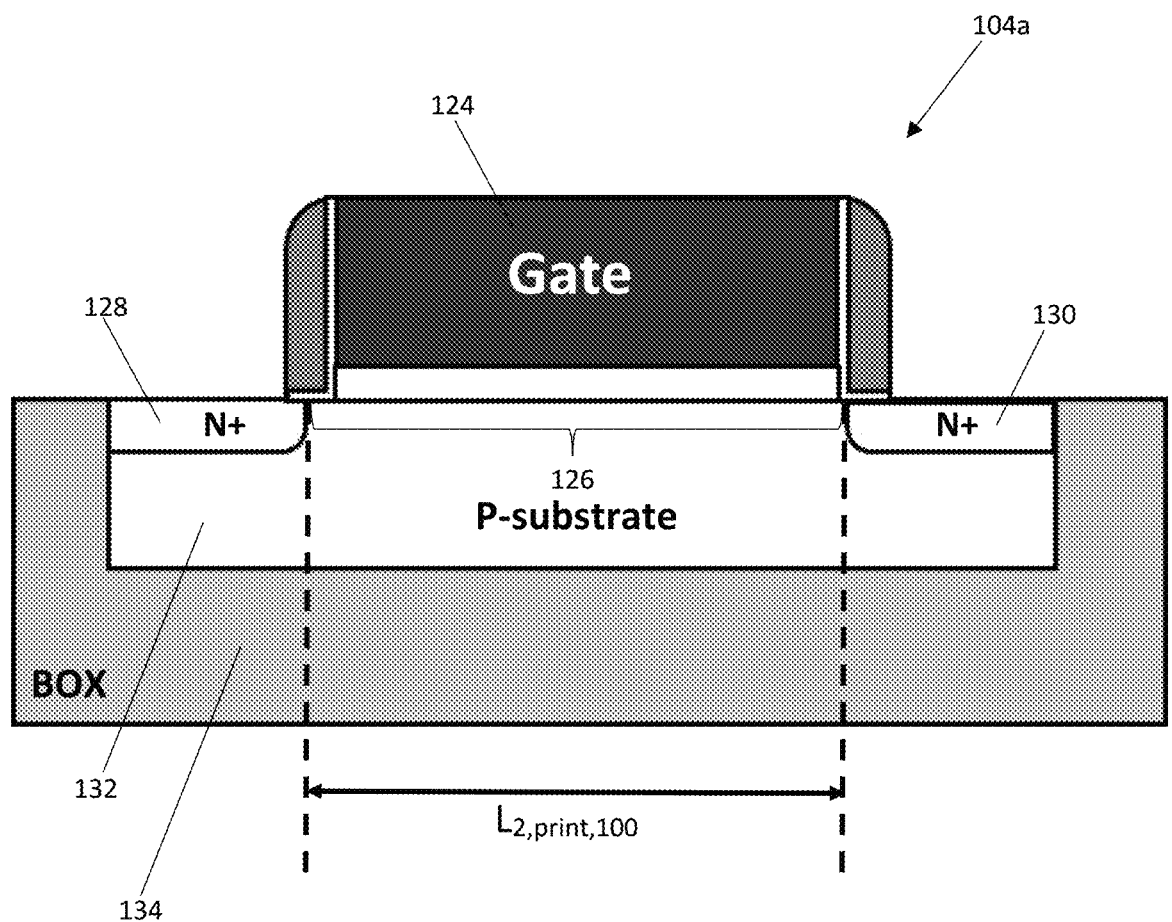
FIG. 1C shows a cross-sectional view of an alternative transistor for use as a second transistor of the prior art sensor of FIGS. 1A-1B.
Figure 8:
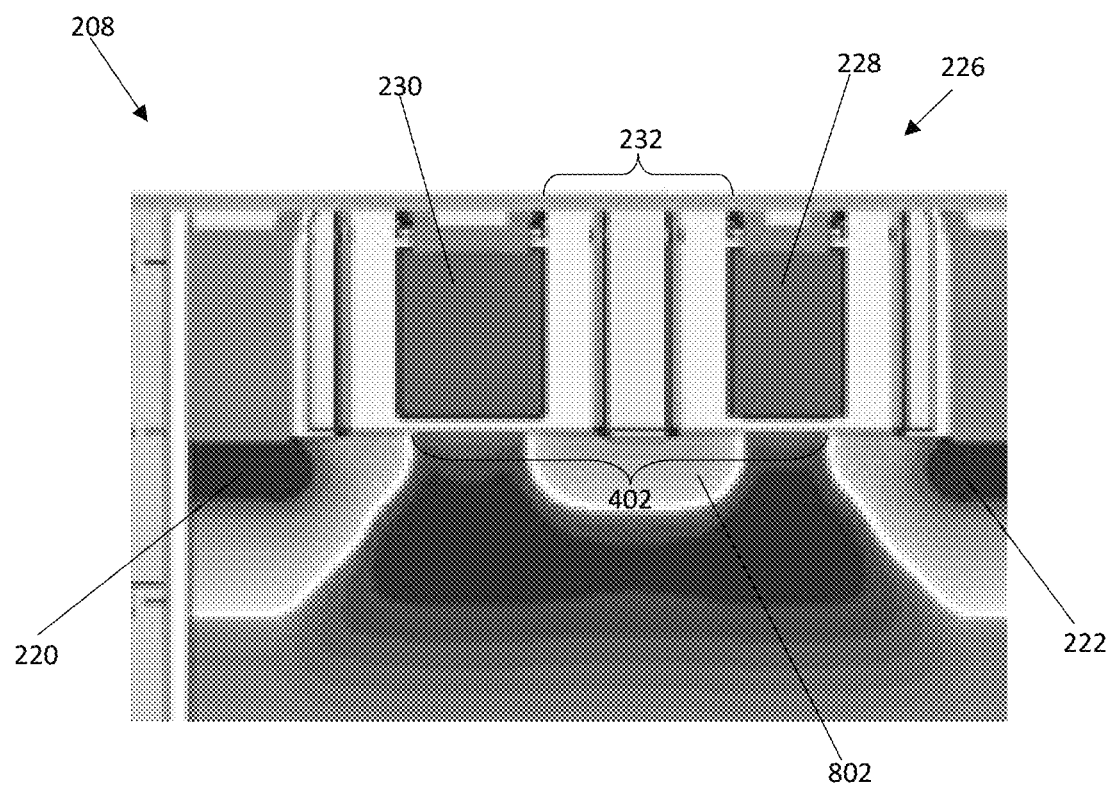
FIG. 8 shows a cross-sectional area of a portion of the sensor device of FIG. 2 simulated with technology computer-aided design (TCAD)
Figure 9:
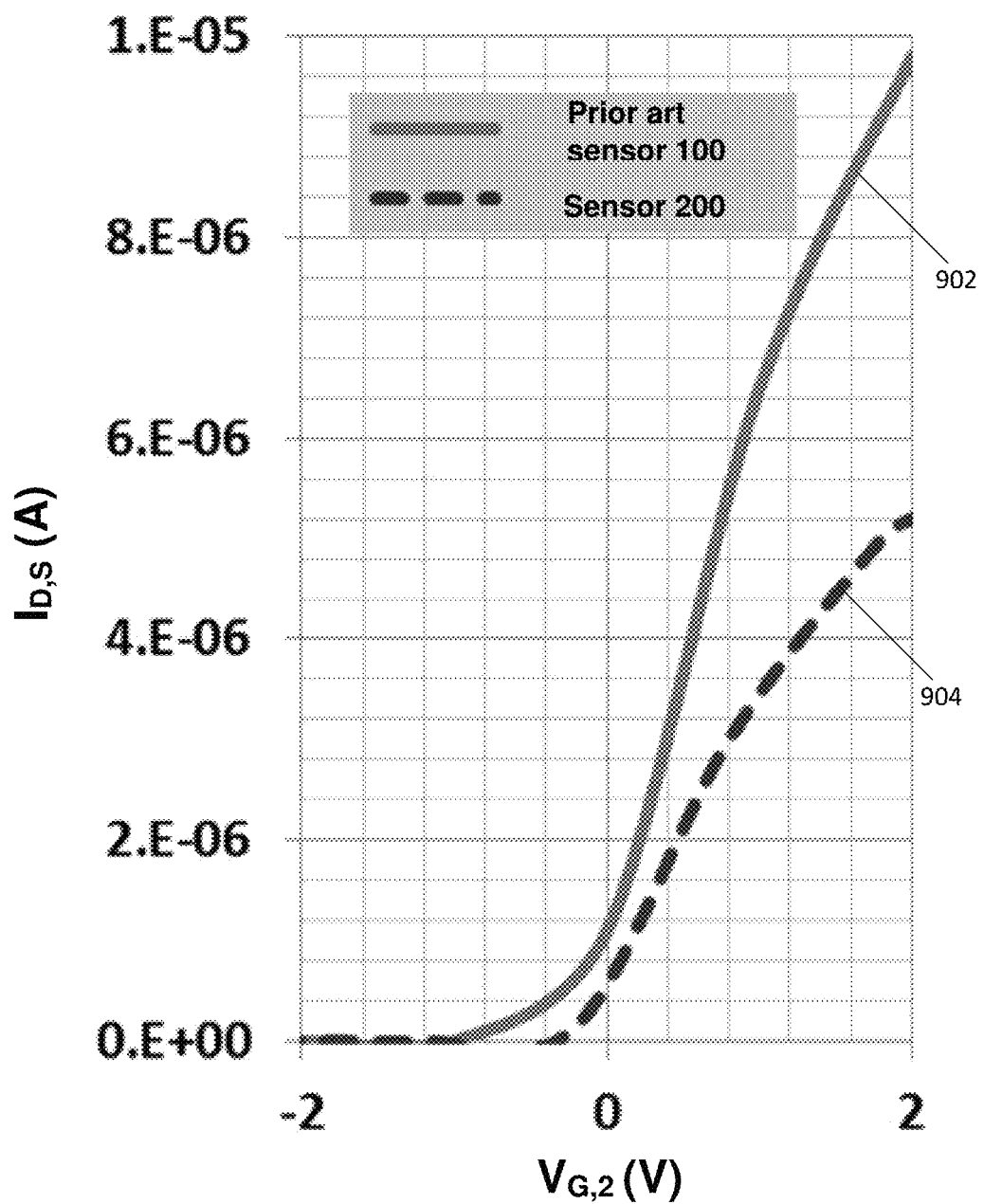
FIG. 9 shows transfer characteristics of the prior art sensor of FIGS. 1A-1B with the alternative transistor of FIG. 1C and the sensor device of FIG. 2 from TCAD simulation results.

The prior art sensor 100 including the alternative transistor 104a in FIG. 1C and the sensor device 200 were simulated using the technology computer-aided design (TCAD). FIG. 8 and FIG. 9 show the TCAD simulation results. In particular, FIG. 8 shows a cross-sectional area of a portion of the second semiconductor structure 208 of the sensor device 200 simulated using TCAD. As shown in FIG. 8, the portion 802 of the second channel region 402 beneath the resistance region 232 is very resistive. FIG. 9 shows the transfer characteristics of the prior art sensor 100 and the sensor device 200. In FIG. 9, a first plot 902 shows the change in the gate voltage $\Delta V_{G,2}$ in the prior art sensor 100 when a pH in the solution 110 changes, whereas a second plot 904 shows the change in the first and second compensatory gate voltages $\Delta V_{G,2}$ in the sensor device 200 when a pH in the solution 502 changes. Based on the TCAD simulation results, it was found that providing the resistance region 232 may increase the effective length of the second channel region 402 by approximately 200 times (i.e. F= $I_{DS,2,0}/I_{DS,2} \approx 200$) and decrease the saturation drain current Idsat by approximately 200 times. It was also found that the sensitivity gain of the sensor device 200 was about 2000 (i.e. Sensitivity Gain=$(W_1/W_2)*(F*L_{2,print,200}/L_1) \approx 2000$) and the sensitivity of the sensor device 200 was about 120 V/pH (i.e. Sensitivity=Sensitivity Gain*60 mV/pH≈120V/pH).

Figure 10:
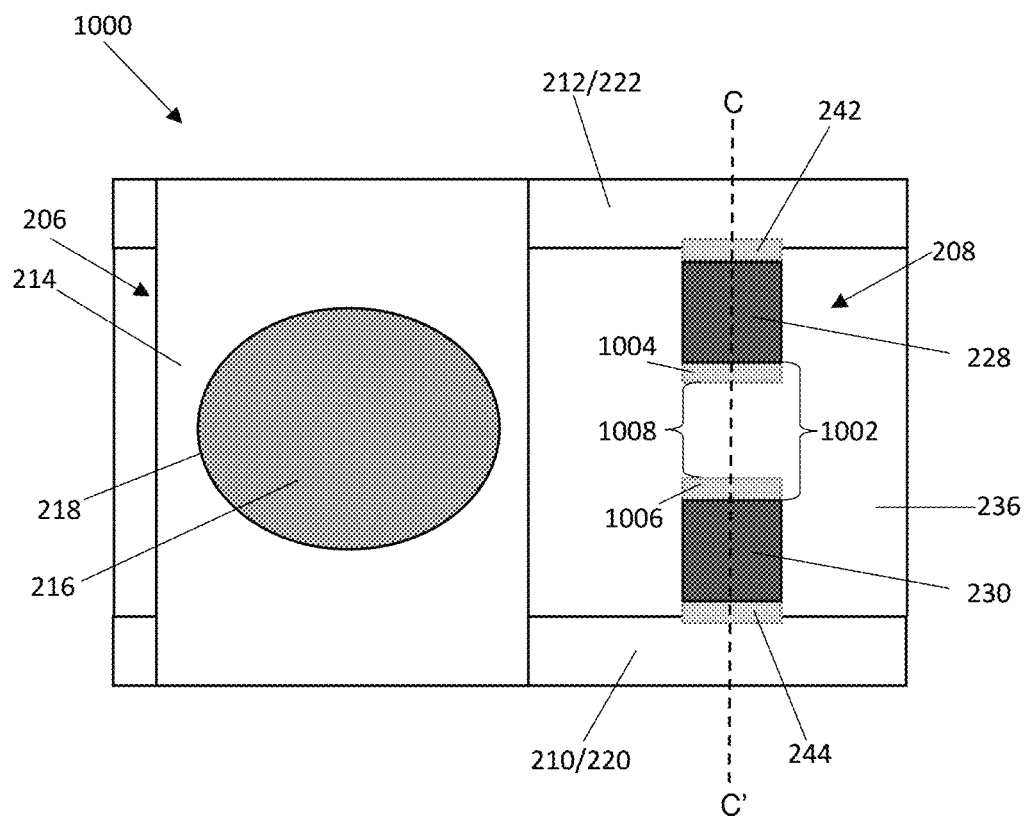
FIG. 10 shows a top view of a sensor device for detecting a change in pH in a solution according to an alternative embodiment of the present invention.
Figure 11:
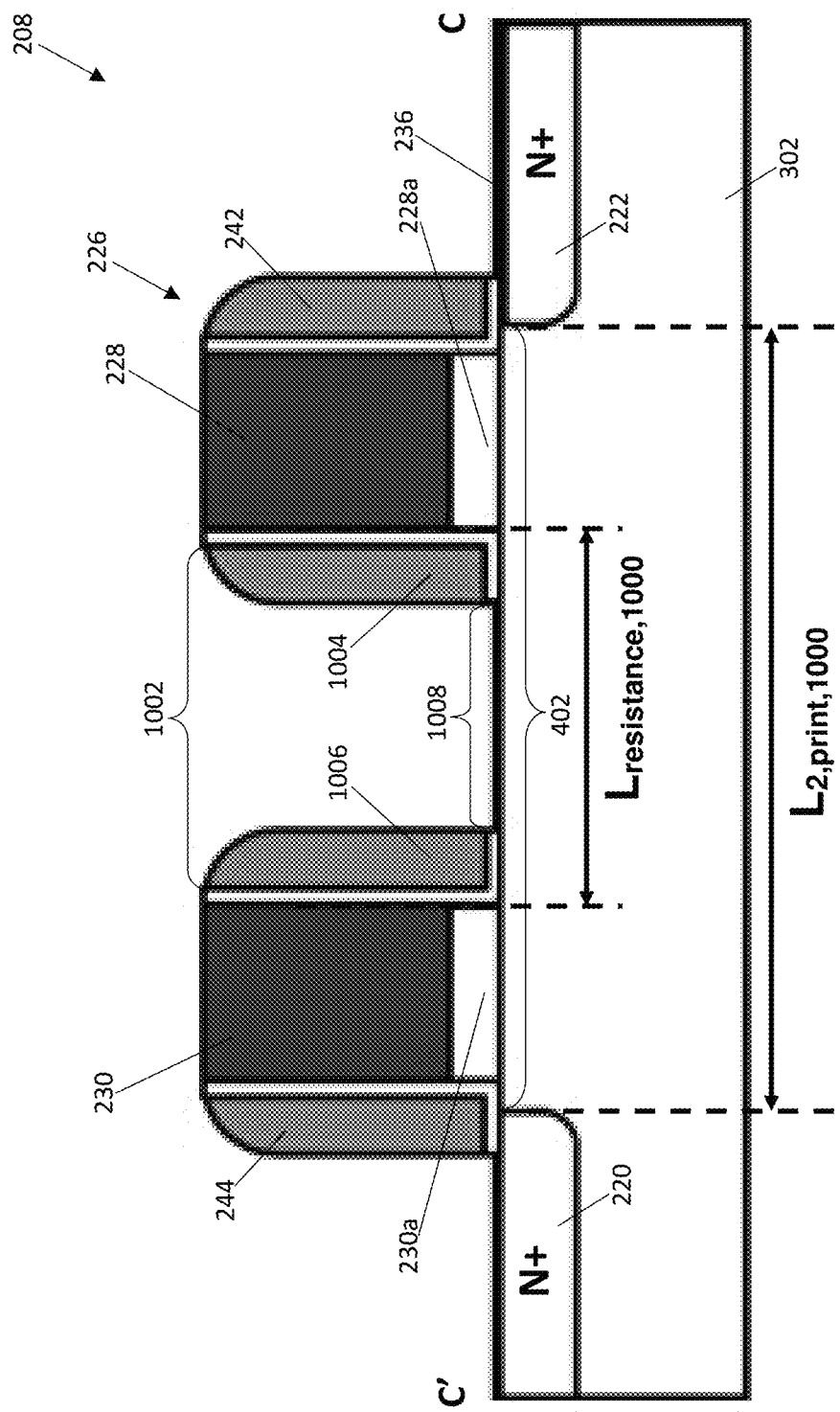
FIG. 11 shows a cross-sectional view of the sensor device of FIG. 10 along the line C-C'.

FIG. 10 shows a top view of a sensor device 1000 for detecting a change in pH in a solution according to an alternative embodiment of the present invention. Sensor device 1000 is similar to sensor device 200, and thus the common features are labelled with the same reference numerals and need not be discussed. FIG. 11 shows a cross-sectional view of the second semiconductor structure 208 of the sensor device 1000 along the line C-C'. Referring to FIG. 10 and FIG. 11, the second semiconductor structure 208 of the sensor device 1000 may also include first and second gate elements 228, 230. A resistance region 1002 may be provided between the first and second gate elements 228, 230. The resistance region 1002 may for example, also include a first spacer element 1004 and a second spacer element 1006. However, unlike resistance region 232, in the resistance region 1002, the first spacer element 1004 does not contact the second spacer element 1006. In other words, a space 1008 is arranged between the first spacer element 1004 and the second spacer element 1006. The length of the space 1008 between the first spacer element 1004 and the second spacer element 1006 may range from about 50 nm to about 50 um, for example about 40 nm, in a non-limiting embodiment, alternatively from about 10 nm to about 90 um. The length of the second channel region 402 of the sensor device 1000 (denoted as $L_{2,print,1000}$ in FIG. 11) may be equal to the length of the second channel region 402 (denoted as $L_{2,print,200}$ in FIG. 2) of the sensor device 200 in a non-limiting embodiment. Alternatively, the length of the second channel region 402 of the sensor device 1000 may be greater than or less than the length of the second channel region 402 of the sensor device 200. The length of the second channel region 402 of sensor device 1000 i.e. $L_{2,print,1000}$ may range from about 5 nm to about 5 um, for example about 80 nm in a non-limiting embodiment, alternatively from about 1 nm to about 10 um. The length of the resistance region 1002 (denoted as $L_{resistance,1000}$ in FIG. 10) of the sensor device 1000 may be equal to, shorter or longer than the length of the resistance region 232 (denoted as $L_{resistance,200}$ in FIG. 2) of the sensor device 200. The length $L_{resistance,1000}$ of the resistance region 1002 of sensor device 1000 may range from about 5 nm to about 500 nm, for example about 15 nm-about 20 nm in a non-limiting embodiment, alternatively from about 1 nm to about 900 nm. If the length $L_{resistance,1000}$ of the resistance region 1002 of the sensor device 1000 is longer than the length $L_{resistance,200}$ of the resistance region 232 of the sensor device 200, the channel length gain factor F may be higher for the sensor device 1000 as compared to the sensor device 200, and in turn, the sensitivity and sensitivity gain of the sensor device 1000 may be higher than that of the sensor device 200. The sensor device 1000 operates in a similar manner as the sensor device 200 as described above.

Figure 12:
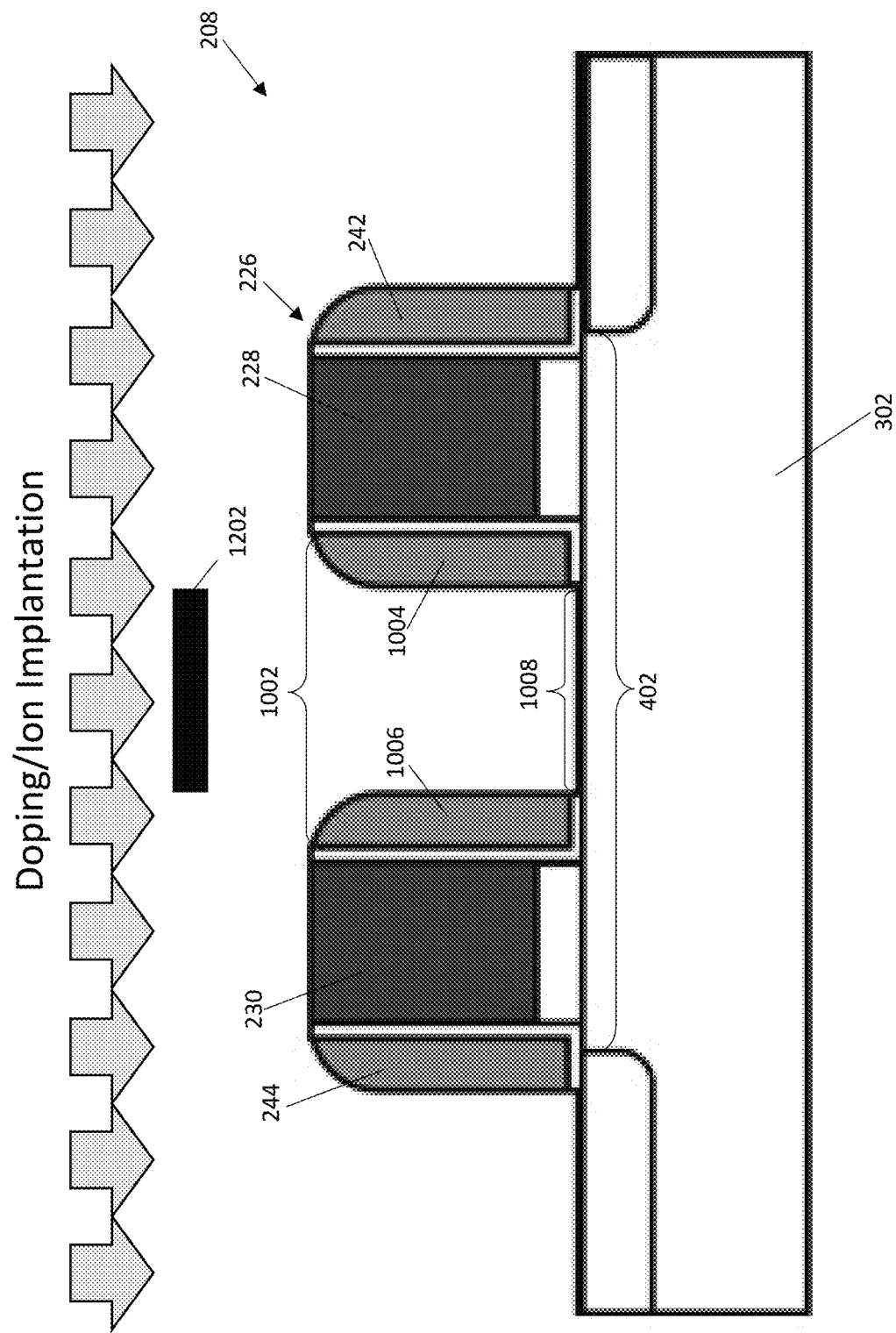
FIG. 12 shows the doping of a portion of the sensor device of FIG. 10.

FIG. 12 shows the doping/ion implantation of the second source and drain regions 220, 222 of the second semiconductor structure 208 of the sensor device 1000 in a non-limiting embodiment. The method of forming the sensor device 1000 is similar to the method of forming the sensor device 200 as described above. However, during the doping/ion implantation of the second source and drain regions 220, 222, a block layer 1202 may be used to block the space 1008 arranged between the first and second spacer elements 1004, 1006. This may additionally block the portion of the second channel region 402 beneath the space 1008 from the doping/ion implantation.

In some non-limiting embodiments, the sensor device 200 may include lightly doped drain (LDD) regions and spacers disposed adjacent the LDD regions. However, these LDD regions and spacers are optional and may be absent in non-limiting embodiments.

In alternative embodiments with a space arranged between the first and second gate elements 228, 230, the second gate structure 226 may not include the spacer elements 1004, 1006, 242, 244 i.e. one or more of such spacer elements 1004, 1006, 242, 244 may be absent. In some other alternative embodiments with a space arranged between the first and second gate elements 228, 230, only the first and second spacer elements 1004, 1006 may be present; whereas, the third and fourth spacer elements 242, 244 are absent. In yet some other alternative embodiments with a space arranged between the first and second gate elements 228, 230, only the third and fourth spacer elements 242, 244 are present; whereas, the first and second spacer elements 1004, 1006 are absent.

In various non-limiting embodiments, the second semiconductor structure 208 may include a nanowire. In various non-limiting embodiments, the second semiconductor structure 208 may include further gate elements (which may include one or more gate elements similar to gate elements 228, 230) and further resistance regions disposed along a length of the substrate 302. The further resistance regions may include only resistance regions similar to resistance region 232, or only resistance regions similar to resistance region 1002 or a combination of resistance regions similar to resistance region 232 and resistance regions similar to resistance region 1002.

Figure 13:
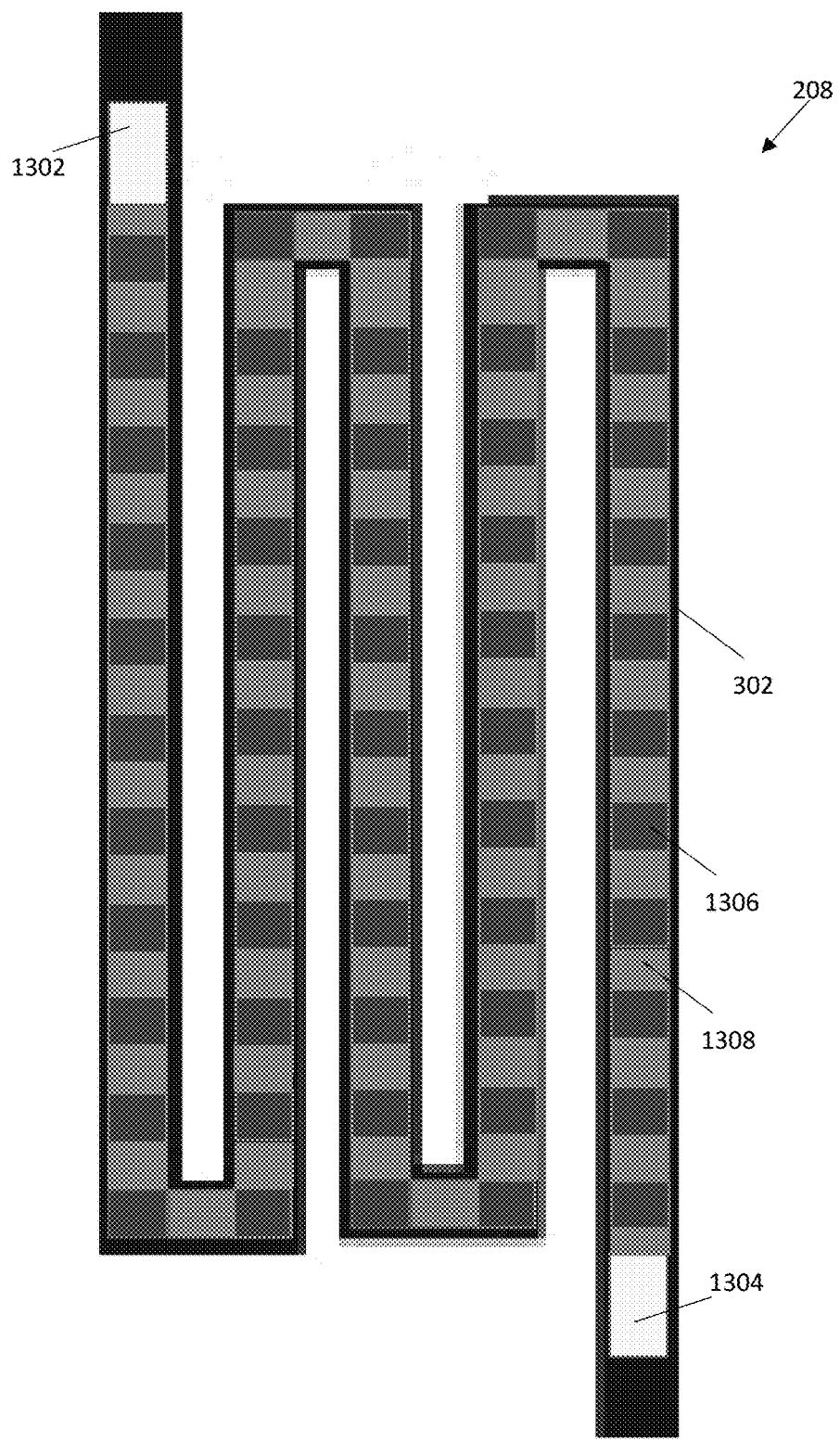
FIG. 13 shows a top view of a semiconductor structure which may be used in the sensor device of FIG. 2 or FIG. 10.

In various non-limiting embodiments, the second semiconductor structure 208 may have different shapes, for example, the substrate 302 may have different shapes. In one example, the second semiconductor structure 208 may have a serpentine shape. FIG. 13 shows a top view of a second semiconductor structure 208 having a serpentine shape according to a non-limiting embodiment. In this second semiconductor structure 208, the substrate 302 (and hence, the second channel region 402) may have a serpentine shape and multiple gate elements 1306 similar to the gate elements 228, 230 may be disposed on the substrate 302 along the length of the substrate 302 between a source region 1302 and a drain region 1304. The multiple gate elements 1306 may be of different lengths and/or heights. Resistance regions 1308 configured to provide a resistance to a second current flow through the second channel region 402 may be disposed between the gate elements 1306. Each of these resistance regions 1308 may for example, be similar to resistance region 232 or resistance region 1002, and the resistance regions 1308 may be of different lengths and/or heights. Providing a second semiconductor structure 208 with a serpentine shape may increase the actual length of the second channel region 402, which may in turn increase the sensitivity of the sensor device 200/1000.

In various non-limiting embodiments, the first semiconductor structure 206 may be replaced with an alternative semiconductor structure as known to those skilled in the art, as long as a current flow passing through a channel region of the alternative semiconductor structure is changed when a pH in the solution changes. In these embodiments, the sensor device may include the alternative semiconductor structure and a second semiconductor structure similar to the second semiconductor structure 208 as described above. In other words, the sensor device may include a substrate 302, and a semiconductor structure 208 including a source region 220 at least partially disposed within the substrate 302, a drain region 222 at least partially disposed within the substrate 302, a channel region 402 disposed between the source region 220 and the drain region 222, and a gate structure 226 disposed over the channel region 402. The gate structure 226 may include a first gate element 228, a second gate element 230, and a resistance region 232/1002. The resistance region 232/1002 may be configured to provide a resistance to a current flow through the channel region 402. The sensor device may be configured such that when another current flow through another channel region of another semiconductor structure (e.g. the above-mentioned alternative semiconductor structure) changes due to the change in pH in a solution received by the another semiconductor structure, the current flow through the channel region changes to compensate for the change in the another current flow through the another channel region of the another semiconductor structure to maintain a constant current flow through the sensor device.

Figure 14A:
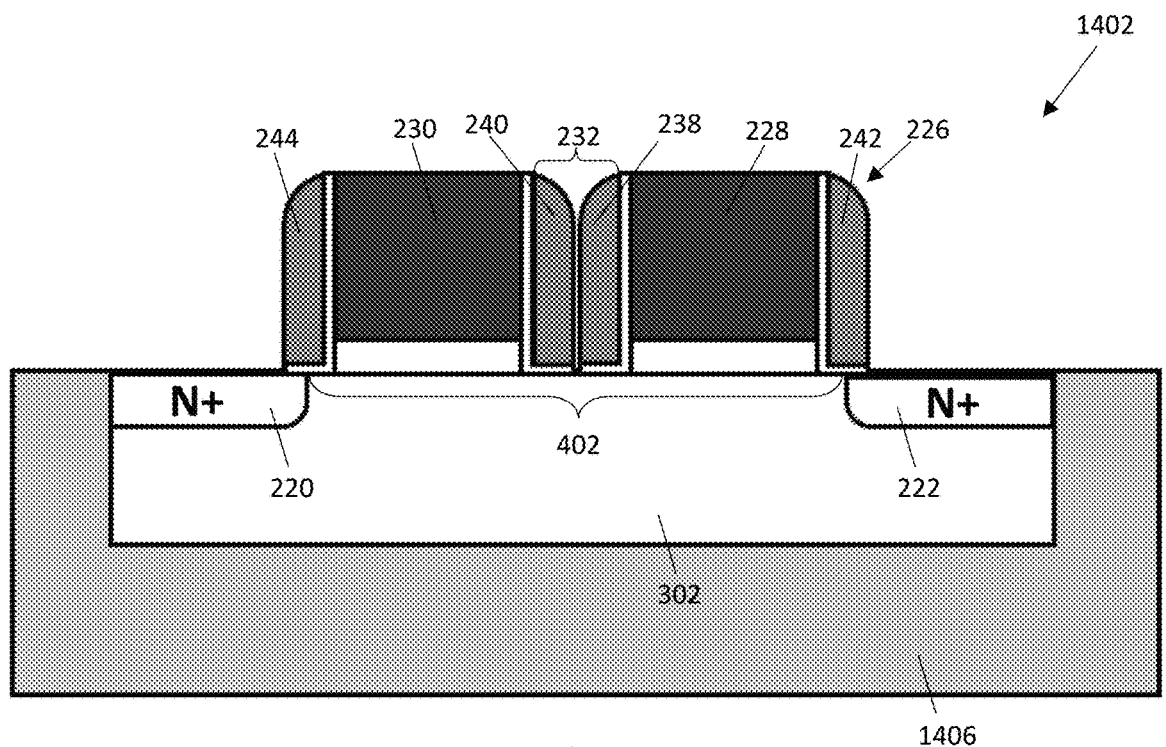
FIGS. 14A and 14B show cross-sectional views of semiconductor structures which may be used in the sensor device of FIG. 2 or FIG. 10.
Figure 14B:
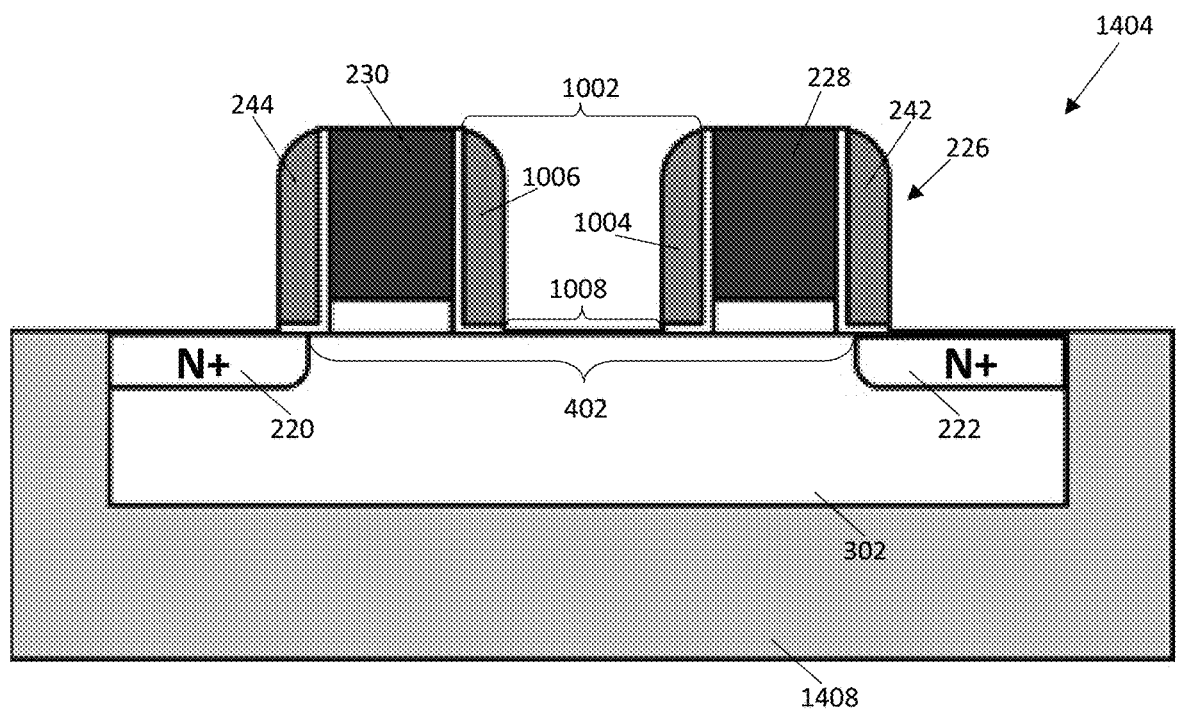

FIGS. 14A and 14B respectively show a second semiconductor structure 1402 and a second semiconductor structure 1404 according to various alternative embodiments. The second semiconductor structures 1402, 1404 are similar to the second semiconductor structure 208 and hence, common features have the same reference numerals and need not be discussed. As shown in FIG. 14A, the second semiconductor structure 1402 may include a buried oxide layer (BOX) 1406 and the substrate 302 may be disposed at least partially within the buried oxide layer 1406. Similarly, as shown in FIG. 13B, the second semiconductor structure 1404 may include a buried oxide layer (BOX) 1408 and the substrate 302 may be disposed at least partially within the buried oxide layer (BOX) 1408.

According to various non-limiting embodiments, the second semiconductor structure 208 may be provided external to the sensor device 200/1000, independently of the first semiconductor structure 206. Such a second semiconductor structure 208 may include a substrate 302, a source region 220 at least partially disposed within the substrate 302, a drain region 222 at least partially disposed within the substrate 302, a channel region 402 disposed between the source region 220 and the drain region 222 and a gate structure 226 disposed over the channel region 402. The gate structure 226 may include a first gate element 228, a second gate element 230 and a resistance region 232/1002. The resistance region 232/1002 may be configured to provide a resistance to a current flow through the channel region 224. The sensor device may be configured such that when another current flow through another channel region of another semiconductor structure changes due to a change in pH in a solution received by the another semiconductor structure, the current flow through the channel region changes to compensate for the change in the another current flow through the another channel region of the another semiconductor structure to maintain a constant current flow through the sensor device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A sensor device comprising:
a substrate;
a first semiconductor structure comprising:
a first source region at least partially disposed within the substrate;
a first drain region at least partially disposed within the substrate;
a first channel region between the first source region and the first drain region; and
a first gate structure disposed over the first channel region;
wherein the first gate structure is configured to receive a solution and a change in pH in the solution changes a first current flow through the first channel region;
a second semiconductor structure comprising:
a second source region at least partially disposed within the substrate;
a second drain region at least partially disposed within the substrate;
a second channel region disposed between the second source region and the second drain region; and
a second gate structure disposed over the second channel region, the second gate structure comprising a first gate element, a second gate element, and a resistance region,
wherein the resistance region is configured to provide a resistance to a second current flow through the second channel region; and
wherein the sensor device is configured such that when the first current flow through the first channel region changes due to the change in pH in the solution, the second current flow through the second channel region changes to compensate for the change in the first current flow through the first channel region to maintain a constant current flow through the sensor device.

2. The sensor device according to claim 1, wherein the resistance region comprises a spacer region.

3. The sensor device according to claim 2, wherein the spacer region comprises a first spacer element laterally adjacent to the first gate element and a second spacer element laterally adjacent to the second gate element.

4. The sensor device according to claim 3, wherein the first spacer element contacts the second spacer element.

5. The sensor device according to claim 3, wherein a space is arranged between the first spacer element and the second spacer element.

6. The sensor device according to claim 1, wherein the second semiconductor structure has a serpentine shape.

7. The sensor device according to claim 1, wherein the first source region and the first drain region have a conductivity type that is the same as the second source region and the second drain region.

8. The sensor device according to claim 1, wherein the first source region and the first drain region have a n-type conductivity, and the second source region and the second drain region have an n-type conductivity.

9. A sensor device comprising:
a substrate;
a semiconductor structure comprising:
a source region at least partially disposed within the substrate;
a drain region at least partially disposed within the substrate;
a channel region disposed between the source region and the drain region; and
a gate structure disposed over the channel region, the gate structure comprising a first gate element, a second gate element, and a resistance region,
wherein the resistance region is configured to provide a resistance to a current flow through the channel region; and
wherein the sensor device is configured such that when another current flow through another channel region of another semiconductor structure changes due to a change in pH in a solution received by the another semiconductor structure, the current flow through the channel region changes to compensate for the change in the another current flow through the another channel region of the another semiconductor structure to maintain a constant current flow through the sensor device.

10. The sensor device according to claim 9, wherein the resistance region comprises a spacer region.

11. The sensor device according to claim 10, wherein the spacer region comprises a first spacer element laterally adjacent to the first gate element and a second spacer element laterally adjacent to the second gate element.

12. The sensor device according to claim 11, wherein the first spacer element contacts the second spacer element.

13. The sensor device according to claim 11, wherein a space is arranged between the first spacer element and the second spacer element.

14. The sensor device according to claim 9, wherein the sensor device has a serpentine shape.

15. A method comprising:
obtaining a substrate having a first semiconductor structure formed thereon; wherein the first semiconductor structure comprises a first source region at least partially disposed within the substrate, a first drain region at least partially disposed within the substrate, a first channel region between the first source region and the first drain region, and a first gate structure disposed over the first channel region and configured to receive a solution; wherein a change in pH in the solution changes a first current flow through the first channel region;
forming a second semiconductor structure, wherein forming the second semiconductor structure comprises:
disposing a second source region at least partially within the substrate;
disposing a second drain region at least partially within the substrate;
disposing a second channel region between the second source region and the second drain region; and
disposing a second gate structure over the second channel region, wherein the second gate structure comprises a first gate element, a second gate element, and a resistance region;
wherein the resistance region is configured to provide a resistance to a second current flow through the second channel region; and
wherein the sensor device is configured such that when the first current flow through the first channel region changes due to a change in pH in the solution, the second current flow through the second channel region changes to compensate for the change in the first current flow through the first channel region to maintain a constant current flow through the sensor device.

16. The method according to claim 15, wherein disposing the second gate structure over the second channel region comprises:

forming the first gate element;

forming the second gate element; and forming a spacer region between the first and second gate elements.

17. The method according to claim 16, wherein forming the spacer region between the first and second gate elements comprises:

forming a first spacer element laterally adjacent to the first gate element; and forming a second spacer element laterally adjacent to the second gate element and in contact with the first spacer element.

18. The method according to claim 16, wherein forming the spacer region between the first and second gate elements comprises:

forming a first spacer element laterally adjacent to the first gate element; and forming a second spacer element laterally adjacent to the second gate element with a space arranged between the first spacer element and the second spacer element.

* * * * *